US007982541B2

United States Patent
(12) United States Patent
Nakai et al.

(10) Patent No.: US 7,982,541 B2
(45) Date of Patent: Jul. 19, 2011

(54) AGC CIRCUIT

(75) Inventors: Takayuki Nakai, Osaka (JP); Takuma Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/757,939

(22) Filed: Apr. 9, 2010

(65) Prior Publication Data

US 2010/0259330 A1 Oct. 14, 2010

(30) Foreign Application Priority Data

Apr. 13, 2009 (JP) ................................ 2009-096819

(51) Int. Cl.
*H03G 3/10* (2006.01)

(52) U.S. Cl. ......... 330/279; 330/278; 330/129; 455/126

(58) Field of Classification Search .................. 330/279, 330/278, 129; 455/126
See application file for complete search history.

(56) References Cited

U.S. PATENT DOCUMENTS 4,066,977 A 1/1978 Chambers
4,634,997 A 1/1987 Tompsett
4,691,172 A * 9/1987 Fukahori et al. .............. 330/129
5,117,201 A 5/1992 Luther
5,680,075 A * 10/1997 Sacca ........................... 330/279
6,122,331 A 9/2000 Dumas
6,169,638 B1 * 1/2001 Morling .......................... 360/46
7,015,759 B2 * 3/2006 Ishida et al. .................. 330/279
7,443,242 B2 * 10/2008 Ishida .......................... 330/279
2004/0178851 A1 9/2004 Ishida
2006/0044065 A1 3/2006 Ishida

FOREIGN PATENT DOCUMENTS

JP 60-123115 7/1985
JP 2004-274571 9/2004
JP 2006-67012 3/2006

* cited by examiner

*Primary Examiner* — Patricia Nguyen
(74) *Attorney, Agent, or Firm* — McDermott Will & Emery LLP

(57) ABSTRACT

A count control signal generating section for generating a count control signal on the basis of an output signal of a variable gain amplifier; an up/down counter for performing an up-count operation or a down-count operation on the basis of the count control signal; a gain control signal generating section for generating a gain control signal to be supplied to the variable gain amplifier on the basis of a count value of the up/down counter; and a state detector section for outputting a state detection signal indicating whether a state of a circuit operation is a steady state or another state are provided. When the state detection signal indicates that the state of the circuit operation is the steady state, the operation of at least one of the up/down counter and the gain control signal generating section is controlled so as to fix the gain control signal.

31 Claims, 22 Drawing Sheets

AGC CIRCUIT

TECHNICAL FIELD

The present invention relates to an AGC (Automatic Gain Control) circuit used in a communication system or an audio system for controlling the gain of a variable gain amplifier in accordance with the amplitude of an input signal.

BACKGROUND ART

Examples of a conventional AGC circuit not requiring an integrator circuit using a capacitor and easily contained in an integrated circuit are a gain control circuit disclosed in Japanese Laid-Open Patent Publication No. 60-123115 and an AGC circuit proposed by the present Applicant in Japanese Laid-Open Patent Publication No. 2004-274571.

FIG. 20 illustrates the exemplified conventional AGC circuit described in Japanese Laid-Open Patent Publication No. 2004-274571. In FIG. 20, a reference sign A1 denotes a signal input terminal to which an input signal VA is supplied. A reference numeral 101 denotes a variable gain amplifier that outputs an output signal VB by amplifying or attenuating the voltage of the input signal VA in accordance with its gain controlled in accordance with a gain control voltage V108. A reference sign B1 denotes a signal output terminal for outputting the output signal VB of the variable gain amplifier 101. A reference numeral 102 denotes a rectifier for rectifying the output voltage of the variable gain amplifier 101. A reference numeral 103 denotes a voltage comparator that compares a rectified signal having been rectified by the rectifier 102, namely, an output signal V101, with an arbitrary threshold voltage V102 precedently determined for outputting an output signal V103 at a high level when the output signal V101 is higher than the threshold voltage V102 and outputting the output signal V103 at a low level when the output signal V101 is lower than the threshold voltage V102. A reference numeral 104 denotes a threshold voltage input terminal through which the threshold voltage V102 is input to the voltage comparator 103. A reference numeral 105 denotes an up/down counter. A reference numeral 106 denotes a count control terminal for inputting the output voltage V103 of the voltage comparator 103 as a control signal V104 for controlling an up-count operation and a down-count operation. A reference numeral 107 denotes an up-count clock terminal for inputting an up-count clock signal V105. A reference numeral 108 denotes a down-count clock terminal for inputting a down-count clock signal V106. A reference numeral 109 denotes a D/A converter section for outputting a DC output voltage V107 in accordance with the count value of the up/down counter 105. A reference numeral 110 denotes a DC amplifier having an arbitrarily set gain, receiving the DC output voltage V107 of the D/A converter section 109 as an input signal and outputting the gain control voltage V108.

The operation of the conventional AGC circuit having the aforementioned configuration will now be described with reference to an accompanying drawing.

FIG. 21 illustrates the output signal VB of the variable gain amplifier 101, the output voltage V101 of the rectifier 102, the output voltage V103 of the voltage comparator 103, the up-count clock signal V105, the down-count clock signal V106 and the DC output voltage V107 of the D/A converter section 109. Incidentally, it is assumed for simplifying description that each of the up-count clock signal V105 and the down-count clock signal V106 is a clock pulse with a constant frequency and that the output signal VB is a sine wave.

In FIG. 21, the output signal VB having a sine wave waveform of the variable gain amplifier 101 is rectified by the rectifier 102. The output voltage V101 of the rectifier 102 attains a pulsating waveform and is input to the voltage comparator 103. The voltage comparator 103 compares the output voltage V101 of the rectifier 102 with the precedently set threshold voltage V102. As a result, the output voltage V103 of the voltage comparator 103 attains a pulse waveform. The thus obtained output voltage V103 of the voltage comparator 103 works as the control signal V104 for the up-count operation and the down-count operation of the up/down counter 105, so as to be input to the count control terminal 106 of the up/down counter 105.

On the other hand, the up-count clock terminal 107 of the up/down counter 105 is supplied with the up-count clock signal V105 and the down-count clock terminal 108 is supplied with the down-count clock signal V106.

The up/down counter 105 performs the up-count operation according to an up-count frequency set in accordance with the up-count clock signal V105 in a period T1 when the voltage on the count control terminal 106 is at a high level. Alternatively, in a period T2 when the voltage on the count control terminal 106 is at a low level, it performs the down-count operation according to a down-count frequency set in accordance with the down-count clock signal V106. Therefore, the up/down counter 105 alternately repeats the up-count and the down-count, and hence, the D/A converter section 109 outputting a DC voltage in accordance with the count value C of the up/down counter 105 outputs the DC output voltage V107 as illustrated in FIG. 21.

The DC output voltage V107 of the D/A converter section 109 is amplified by the DC amplifier 110 to arbitrary magnitude to be used as the gain control voltage V108 for the variable gain amplifier 101. The gain of the variable gain amplifier 101 is changed in accordance with the gain control voltage V108 so as to amplify or attenuate the input signal VA.

When the DC output voltage V107 of the D/A converter section 109 is increased, the gain of the variable gain amplifier 101 is lowered and the level of the output signal VB is lowered, and hence, the down-count is proceeded. Therefore, the DC output voltage V107 of the D/A converter section 109 is lowered, and hence, the gain of the variable gain amplifier 101 is increased in turn. As a result, the level of the output signal VB is increased, and hence, the up-count is proceeded. By repeating this cycle, the level of the output signal VB of the variable gain amplifier 101 is converged at a constant level.

SUMMARY OF INVENTION

Technical Problem

According to the conventional AGC circuit having the aforementioned configuration, an AGC circuit not requiring an integrator circuit using a capacitor and easily contained in an integrated circuit may be realized, but the following problem occurs, which will be described with reference to FIGS. 22, 23A and 23B:

In the above-described conventional AGC circuit, even in a steady state where the output signal is stable at a constant amplitude level, the attenuation through the up-count and the amplification through the down-count are alternately repeated technically speaking. Therefore, minute changes (level differences) X1, X2 and X3 are caused in the output signal as illustrated in FIG. 22.

Comparison in influence of such minute changes on the characteristic of an output signal is obtained as FFT (fast Fourier transformation) spectra illustrated in FIGS. 23A and 233. FIG. 23A illustrates an FFT spectrum of the output signal obtained without performing the AGC operation and FIG. 23B illustrates an FFT spectrum of the output signal obtained with the AGC operation performed.

It is understood from these two FET spectra that the output signal obtained with the AGC operation performed is inferior to that obtained without performing the AGC operation in a noise harmonic distortion THD+N (Total Harmonic Distortion+Noise) characteristic, which is defined as "a ratio of an effective value of a noise component+an effective value of a high frequency component in a fundamental signal to an effective value of the fundamental signal obtained at output", on the basis of the spectrum increased in the vicinity of the fundamental signal.

This inferiority is caused because the attenuation and the amplification of the output signal are always alternately repeated even in the steady state. In particular, a major cause is that the attenuation through the up-count is performed in the vicinity of the peak of the signal unavoidably because of the system as mentioned in the description of the operation of the conventional AGC circuit with reference to FIG. 21. Since it is distortion and noise that largely affect the auditory sense of a human being, it is necessary to suppress this spectrum increase in the vicinity of the fundamental signal for realizing higher tone quality.

The present invention solves the aforementioned conventional problem, and an object of the invention is providing an AGC circuit better for auditory sensation in the field of an AGC circuit not requiring an integrator circuit using a capacitor.

Solution to Problem

In order to solve the aforementioned problem, a state detector section for detecting a state of a circuit operation is provided in this invention, so as to control the operation in such a manner as to halt the operation of at least one of an up/down counter and a gain control signal generating section, to disconnect a signal path between the up/down counter and the gain control signal generating section or to cause a similar effect when it is detected that the circuit operation is in a steady state, whereby fixing a gain control signal.

Specifically, the first AGC circuit of this invention includes a variable gain amplifier with a gain controlled in accordance with a gain control signal; a count control signal generating section for generating a first count control signal on the basis of an output signal of the variable gain amplifier; a first up/down counter for performing an up-count operation for a first up-count clock signal or a down-count operation for a first down-count clock signal on the basis of the first count control signal; a gain control signal generating section for generating the gain control signal on the basis of a count value of the first up/down counter; and a state detector section for detecting a state of a circuit operation and outputting a state detection signal indicating whether the state of the circuit operation is a steady state or another state, and when the state detection signal indicates that the state of the circuit operation is the steady state, an operation of at least one of the first up/down counter and the gain control signal generating section is controlled in such a manner as to fix the gain control signal.

According to this configuration, since the state detector section for detecting the state of the circuit operation is included, when it is detected that the circuit operation is the steady state, the operation is controlled so that the operation of at least one of the first up/down counter and the gain control signal generating section may be halted, that a signal path between the first up/down counter and the gain control signal generating section may be disconnected, or that a similar effect may be attained, and thus, the gain control signal may be fixed. Therefore, occurrence of minute changes (level differences) in an output signal derived from attenuation and amplification performed in the steady state may be suppressed, and spectrum increase otherwise caused in the vicinity of a fundamental signal may be suppressed. Accordingly, when the invention is applied to, for example, audio signal processing, an AGC circuit better for auditory sensation may be realized.

In the first AGC circuit of the invention, the gain control signal generating section preferably includes a first digital/analog converter section for converting the count value of the first up/down counter into an analog signal to be output as the gain control signal (as a second AGC circuit of the invention).

According to this configuration, the gain control signal generating section includes the first digital/analog converter section for converting the count value of the first up/down counter into an analog signal, and therefore, the gain of the variable gain amplifier may be controlled in accordance with the analog signal.

The first AGC circuit of the invention preferably further includes a second up/down counter for performing an up-count operation for a second up-count clock signal or a down-count operation for a second down-count clock signal on the basis of a second count control signal, and the gain control signal generating section preferably generates the second count control signal on the basis of a result of comparison between the count value of the first up/down counter and a count value of the second up/down counter, and generates the gain control signal on the basis of a larger one of the count value of the first up/down counter and the count value of the second up/down counter instead of generating the gain control signal on the basis of the count value of the first up/down counter, and when the state detection signal indicates that the state of the circuit operation is the steady state, an operation of at least one of the first and second up/down counters and the gain control signal generating section is preferably controlled in such a manner as to fix the gain control signal instead of controlling the operation of at least one of the first up/down counter and the gain control signal generating section in such a manner as to fix the gain control signal (as a third AGC circuit of the invention).

According to this configuration, since the gain control signal generating section for generating the gain control signal on the basis of a larger one of the count value of the first up/down counter and the count value of the second up/down counter is provided, the responsibility of the gain control signal may be changed in accordance with change in the input signal. Accordingly, not only the effect attained by the first AGC circuit of the invention may be attained but also an AGC circuit further better for auditory sensation may be realized.

In the third AGC circuit of the invention, the gain control signal generating section preferably includes a first digital/analog converter section for converting the count value of the first up/down counter into an analog signal; a second digital/analog converter section for converting the count value of the second up/down counter into an analog signal; a gain control signal switching circuit for selecting one of an output of the first digital/analog converter section and an output of the second digital/analog converter section to be output as the gain control signal; and a signal generating section for generating the second count control signal by comparing the output of the first digital/analog converter section and the output of the second digital/analog converter section, and the gain control signal switching circuit is preferably controlled in accordance with the second count control signal (as a fourth AGC circuit of the invention).

According to this configuration, since the gain control signal generating section includes the first digital/analog converter section for converting the count value of the first up/down counter into an analog signal; the second digital/analog converter section for converting the count value of the second up/down counter into an analog signal; and the gain control signal switching circuit for selecting one of the output of the first digital/analog converter section and the output of the second digital/analog converter section to be output as the gain control signal, the gain of the variable gain amplifier may be controlled in accordance with the analog signal.

The first AGC circuit of the invention preferably further includes a second up/down counter for performing an up-count operation for a second up-count clock signal or a down-count operation for a second down-count clock signal on the basis of a second count control signal, and the gain control signal generating section preferably generates the second count control signal on the basis of a result of comparison between the count value of the first up/down counter and a count value of the second up/down counter, and the AGC circuit preferably further includes a down-count clock signal generating section for generating the first down count clock signal with a frequency according to the result of the comparison between the count value of the first up/down counter and the count value of the second up/down counter (as a fifth AGC circuit of the invention).

According to this configuration, the second count control signal is generated on the basis of the result of the comparison between the count value of the first up/down counter and the count value of the second up/down counter, the first down count clock signal is generated with a frequency according to the result of the comparison, and the gain control signal is generated on the basis of the count value of the first up/down counter, and therefore, not only the effect attained by the first AGC circuit of the invention may be attained but also the responsibility of the gain control signal may be changed in accordance with change in the input signal, and the configuration of the gain control signal generating section may be simplified, resulting in reducing the area occupied by the circuit and reducing the cost. Furthermore, since there is no need to provide a switching circuit for switching the supplier of the gain control signal, distortion in the output waveform and generation of an abnormal signal derived from switching noise or the like of the switching circuit may be suppressed.

In the fifth AGC circuit of the invention, the gain control signal generating section preferably includes a first digital/analog converter section for converting the count value of the first up/down counter into an analog signal to be output as the gain control signal; a second digital/analog converter section for converting the count value of the second up/down counter into an analog signal; and a signal generating section for generating the second count control signal by comparing an output of the first digital/analog converter section and an output of the second digital/analog converter section (as a sixth AGC circuit of the invention).

According to this configuration, since the gain control signal generating section includes the first digital/analog converter section for converting the count value of the first up/down counter into an analog signal; the second digital/analog converter section for converting the count value of the second up/down counter into an analog signal; and the signal generating section for generating the second count control signal by comparing the output of the first digital/analog converter section and the output of the second digital/analog converter section, the gain of the variable gain amplifier may be controlled in accordance with the analog signal.

In the fifth AGC circuit of the invention, the gain control signal generating section preferably includes a first digital/analog converter section for converting the count value of the first up/down counter into an analog signal to be output as the gain control signal; and a functional unit for generating the second count control signal by calculating to compare the count value of the first up/down counter and the count value of the second up/down counter (as a seventh AGC circuit of the invention).

According to this configuration, since the gain control signal generating section includes the digital/analog converter section for converting the count value of the first up/down counter into an analog signal; and the functional unit for generating the second count control signal by calculating to compare the count value of the first up/down counter and the count value of the second up/down counter, merely one digital/analog converter section is sufficiently provided, resulting in attaining a space saver property and cost reduction.

Also in this case, the down-count clock signal generating section preferably generates the first down-count clock signal with a frequency according to the output of the functional unit.

In the fifth AGC circuit of the invention, the gain control signal generating section preferably includes a first digital/analog converter section for converting the count value of the first up/down counter into an analog signal to be output as the gain control signal, and the state detector section preferably includes a functional unit for generating the second count control signal by calculating to compare the count value of the first up/down counter and the count value of the second up/down counter (as an eighth AGC circuit of the invention).

According to this configuration, since the gain control signal generating section includes the digital/analog converter section for converting the count value of the first up/down counter into an analog signal, and the state detector section includes the functional unit for generating the second count control signal by calculating to compare the count value of the first up/down counter and the count value of the second up/down counter, it is possible to realize an AGC circuit better for auditory sensation in which the occurrence of minute changes (level differences) in the output signal derived from attenuation and amplification performed in the steady state may be suppressed and spectrum increase otherwise caused in the vicinity of a fundamental signal may be suppressed.

In any of the first and second AGC circuits of the invention, the state detector section preferably detects change in the gain caused in a prescribed period of time in the variable gain amplifier (as a ninth AGC circuit of the invention).

According to this configuration, the state detector section detects the change in the gain, and hence, the steady state may be detected with a small scaled circuit configuration.

In any of the third through eighth AGC circuits of the invention, the state detector section preferably detects change in the gain caused in a prescribed period of time in the variable gain amplifier (as a tenth AGC circuit of the invention).

According to this configuration, the state detector section detects the change in the gain, and hence, the steady state may be detected with a small scaled circuit configuration.

In any of the first and second AGC circuits of the invention, the state detector section preferably detects change in amplitude of the output signal of the variable gain amplifier (as an eleventh AGC circuit of the invention).

According to this configuration, the state detector section detects the change in the amplitude of the output signal, and hence, transition from the steady state to another state may be rapidly detected.

In any of the third through eighth AGC circuits of the invention, the state detector section preferably detects change in amplitude of the output signal of the variable gain amplifier (as a twelfth AGC circuit of the invention).

According to this configuration, the state detector section detects the change in the amplitude of the output signal, and hence, transition from the steady state to another state may be rapidly detected.

In any of the first and second AGC circuits of the invention, the state detector section preferably detects whether or not at least one of the up-count operation and the down-count operation of the first up/down counter has been continuously performed by a prescribed number of or more times (as a thirteenth AGC circuit of the invention).

According to this configuration, since the state detector section detects whether or not at least one of the up-count operation and the down-count operation of the first up/down counter has been continuously performed by a prescribed number of or more times, the steady state may be detected with a small scaled circuit configuration.

In any of the third through eighth AGC circuits of the invention, the state detector section preferably detects whether or not at least one of the up-count operation and the down-count operation of at least one of the first up/down counter and the second up/down counter has been continuously performed by a prescribed number of or more times (as a fourteenth AGC circuit of the invention).

According to this configuration, since the state detector section detects whether or not at least one of the up-count operation and the down-count operation of at least one of the first and second up/down counters has been continuously performed by a prescribed number of or more times, the steady state may be detected with a small scaled circuit configuration.

In any of the first, second and eighth AGC circuits of the invention, the state detector section preferably detects two or more of change in the gain caused in a prescribed period of time in the variable gain amplifier, change in amplitude of the output signal of the variable gain amplifier and whether or not at least one of the up-count operation and the down-count operation of the first up/down counter has been continuously performed by a prescribed number of or more times (as a fifteenth AGC circuit of the invention).

According to this configuration, since the state detector section detects two or more of change in the gain caused in a prescribed period of time in the variable gain amplifier, change in the amplitude of the output signal of the variable gain amplifier and whether or not at least one of the up-count operation and the down-count operation of the first up/down counter has been continuously performed by a prescribed number of or more times, an AGC circuit with high responsibility against change in the state of the circuit operation may be realized.

In any of the third through eighth AGC circuits of the invention, the state detector section preferably detects two or more of change in the gain caused in a prescribed period of time in the variable gain amplifier, change in amplitude of the output signal of the variable gain amplifier and whether or not at least one of the up-count operation and the down-count operation of at least one of the first up/down counter and the second up/down counter has been continuously performed by a prescribed number of or more times (as a sixteenth AGC circuit of the invention).

According to this configuration, since the state detector section detects two or more of change in the gain caused in a prescribed period of time in the variable gain amplifier, change in the amplitude of the output signal of the variable gain amplifier and whether or not at least one of the up-count operation and the down-count operation of at least one of the first and second up/down counters has been continuously performed by a prescribed number of or more times, an AGC circuit with high responsibility against change in the state of the circuit operation may be realized.

Any of the first, second, fifth, eighth, ninth, eleventh and thirteenth AGC circuits of the invention preferably further includes a zero crossing detector section for detecting what is called a zero crossing point where an input or an output of the variable gain amplifier crosses a prescribed reference voltage, when the state detection signal indicates that the state of the circuit operation is the steady state, the operation of at least one of the first up/down counter and the gain control signal generating section is preferably controlled in such a manner as to be placed in an operation mode where the gain control signal is updated in synchronization with timing of zero crossing instead of controlling the operation of at least one of the first up/down counter and the gain control signal generating section in such a manner as to fix the gain control signal (as a seventeenth AGC circuit of the invention).

According to this configuration, the AGC circuit further includes a zero crossing detector section for detecting what is called a zero crossing point where the input or the output of the variable gain amplifier crosses a prescribed reference voltage, and when the state detection signal indicates that the state of the circuit operation is the steady state, the operation of at least one of the first up/down counter and the gain control signal generating section is controlled in such a manner as to be placed in the operation mode where the gain control signal is updated in synchronization with the timing of zero crossing, and therefore, the gain control signal is updated at the timing of zero crossing when the circuit is in the steady state, the occurrence of minute changes (level differences) in the output signal is suppressed, the spectrum increase otherwise caused in the vicinity of the fundamental signal is suppressed, and the up/down counter is placed in an operable state, and thus, an AGC circuit better for auditory sensation may be realized.

Any of the third, fourth, sixth through eighth, tenth, twelfth and fourteenth AGC circuits of the invention preferably further includes a zero crossing detector section for detecting what is called a zero crossing point where an input or an output of the variable gain amplifier crosses a prescribed reference voltage, when the state detection signal indicates that the state of the circuit operation is the steady state, the operation of at least one of the first and second up/down counters and the gain control signal generating section is preferably controlled in such a manner as to be placed in an operation mode where the gain control signal is updated in synchronization with timing of zero crossing instead of controlling the operation of at least one of the first and second up/down counter and the gain control signal generating section in such a manner as to fix the gain control signal (as an eighteenth AGC circuit of the invention).

According to this configuration, the AGC circuit further includes a zero crossing detector section for detecting what is called a zero crossing point where the input or the output of the variable gain amplifier crosses a prescribed reference voltage, and when the state detection signal indicates that the state of the circuit operation is the steady state, the operation of at least one of the first and second up/down counters and the gain control signal generating section is controlled in such a manner as to be placed in the operation mode where the gain control signal is updated in synchronization with the timing of zero crossing, and therefore, the gain control signal is updated at the timing of zero crossing when the circuit is in the steady state, the occurrence of minute changes (level differences) in the output signal is suppressed, the spectrum increase otherwise caused in the vicinity of the fundamental signal is suppressed, and the up/down counter is placed in an operable state, and thus, an AGC circuit better for auditory sensation may be realized.

Any of the first, second, fifth, eighth, ninth, eleventh and thirteenth AGC circuits of the invention preferably further includes a zero crossing detector section for detecting what is called a zero crossing point where an input or an output of the variable gain amplifier crosses a prescribed reference voltage, and the AGC circuit preferably has a first operation mode where the operation of at least one of the first up/down counter and the gain control signal generating section is controlled in such a manner as to fix the gain control signal when the state detection signal indicates that the state of the circuit operation is the steady state, and a second operation mode where the operation of at least one of the first up/down counter and the gain control signal generating section is controlled in such a manner as to update the gain control signal in synchronization with timing of zero crossing when the state detection signal indicates that the state of the circuit operation is the steady state, and one of the first operation mode and the second operation mode is preferably selectable (as a nineteenth AGC circuit of the invention).

According to this configuration, the AGC circuit has the first operation mode where the operation of at least one of the first up/down counter and the gain control signal generating section is controlled in such a manner as to fix the gain control signal when the state detection signal indicates that the state of the circuit operation is the steady state, and the second operation mode where the operation of at least one of the first up/down counter and the gain control signal generating section is controlled in such a manner as to update the gain control signal in synchronization with the timing of zero crossing when the state detection signal indicates that the state of the circuit operation is the steady state, and one of the first operation mode and the second operation mode is selectable, and therefore, the operation of the AGC circuit may be selected in accordance with an input signal, resulting in increasing general usability of the AGC circuit.

Any of the third, fourth, sixth through eighth, tenth, twelfth and fourteenth AGC circuits of the invention preferably further includes a zero crossing detector section for detecting what is called a zero crossing point where an input or an output of the variable gain amplifier crosses a prescribed reference voltage, and the AGC circuit preferably has a first operation mode where the operation of at least one of the first and second up/down counters and the gain control signal generating section is controlled in such a manner as to fix the gain control signal when the state detection signal indicates that the state of the circuit operation is the steady state, and a second operation mode where the operation of at least one of the first and second up/down counters and the gain control signal generating section is controlled in such a manner as to update the gain control signal in synchronization with timing of zero crossing when the state detection signal indicates that the state of the circuit operation is the steady state, and one of the first operation mode and the second operation mode is preferably selectable (as a twentieth AGC circuit of the invention).

According to this configuration, the AGC circuit has the first operation mode where the operation of at least one of the first and second up/down counters and the gain control signal generating section is controlled in such a manner as to fix the gain control signal when the state detection signal indicates that the state of the circuit operation is the steady state, and the second operation mode where the operation of at least one of the first and second up/down counters and the gain control signal generating section is controlled in such a manner as to update the gain control signal in synchronization with the timing of zero crossing when the state detection signal indicates that the state of the circuit operation is the steady state, and one of the first operation mode and the second operation mode is selectable, and therefore, the operation of the AGC circuit may be selected in accordance with an input signal, resulting in increasing general usability of the AGC circuit.

In any of the seventeenth through twentieth AGC circuits of the invention, the state detector section preferably detects the state of the circuit operation every arbitrary period set by a timer (as a twenty first AGC circuit of the invention).

According to this configuration, since the state detector section detects the state of the circuit operation every arbitrary period set by the timer, the detection timing of the state detector section may be uniquely defined.

In any of the seventeenth through twentieth AGC circuits of the invention, the state detector section preferably detects the state of the circuit operation every period defined by the timing of zero crossing detected by the zero crossing detector section (as a twenty second AGC circuit of the invention).

According to this configuration, since the state detector section detects the state of the circuit operation every period defined by the timing of zero crossing detected by the zero crossing detector section, the state of the circuit operation may be stably detected regardless of the frequency of an input signal.

In any of the seventeenth through twentieth AGC circuits of the invention, the state detector section preferably detects the state of the circuit operation by employing, as a detection period, an earlier one of an arbitrary period set by a timer and a period defined by the timing of zero crossing detected by the zero crossing detector section (as a twenty third AGC circuit of the invention).

According to this configuration, since the state detector section detects the state of the circuit operation by employing, as a detection period, an earlier one of the arbitrary period set by the timer and the period defined by the timing of zero crossing detected by the zero crossing detector section, it is possible to realize an AGC circuit in which the state of the circuit operation is stably detected with respect to an input signal with a frequency higher than the frequency defined by the arbitrary period set by the timer and high responsibility is attained even when a signal with a frequency lower than the frequency defined by the arbitrary period set by the timer is input.

Eighth AGC circuit of the invention preferably further includes a zero crossing detector section for detecting what is called a zero crossing point where an input or an output of the variable gain amplifier crosses a prescribed reference voltage, and the state detector section preferably detects the state of the circuit operation every period defined by the timing of zero crossing detected by the zero crossing detector section (as a twenty forth AGC circuit of the invention).

Eighth AGC circuit of the invention preferably further includes a zero crossing detector section for detecting what is called a zero crossing point where an input or an output of the variable gain amplifier crosses a prescribed reference voltage, and the state detector section preferably detects the state of the circuit operation by employing, as a detection period, an earlier one of an arbitrary period set by a timer and a period defined by the timing of zero crossing detected by the zero crossing detector section (as a twenty fifth AGC circuit of the invention).

Advantageous Effects of Invention

According to the AGC circuit of this invention, minute changes (level differences) in an output signal derived from attenuation and amplification performed in a steady state may be suppressed so as to suppress spectrum increase otherwise caused in the vicinity of a fundamental signal, and hence, when the invention is applied to, for example, audio signal processing, an AGC circuit better for auditory sensation may be realized.

DESCRIPTION OF EMBODIMENTS

Preferred embodiments of the invention will now be described with reference to the accompanying drawings.

Embodiment 1

Embodiment 1 of the invention will now be described with reference to the accompanying drawing.

Figure 1:
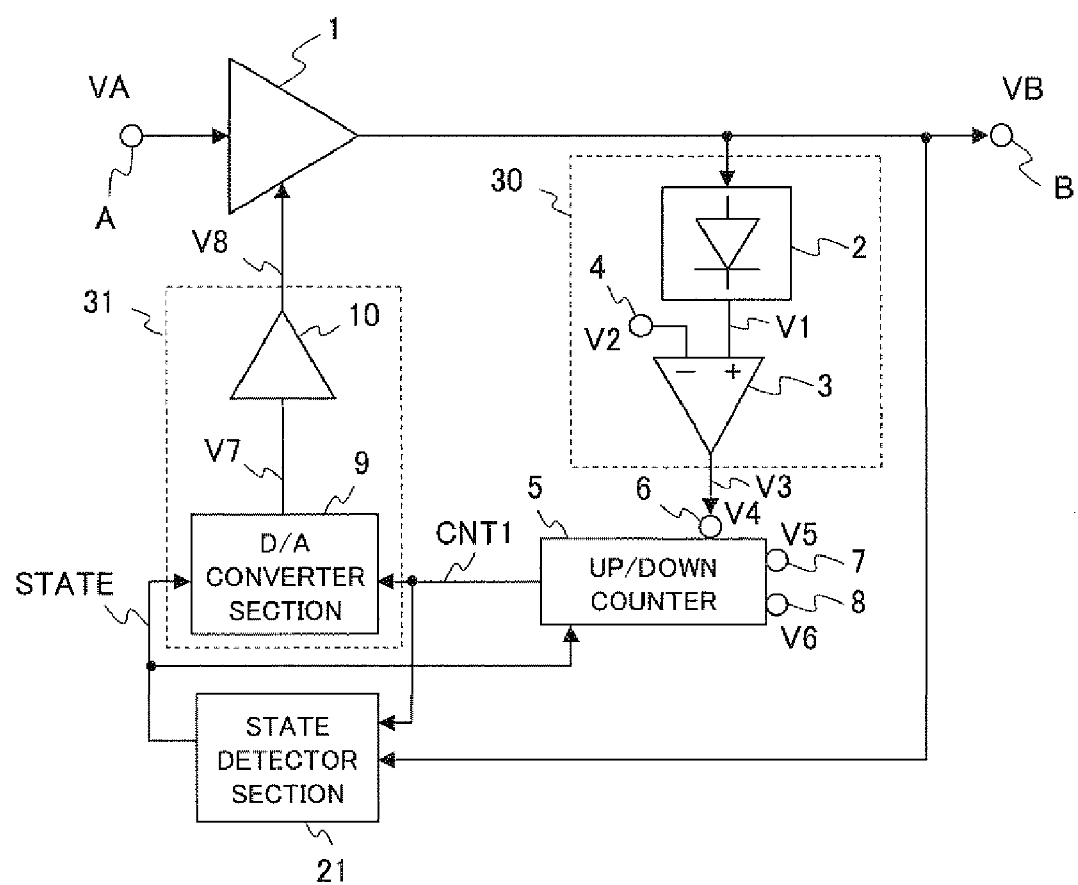
FIG. 1 is a block diagram illustrating the configuration of an AGC circuit according to Embodiment 1 of the invention.

FIG. 1 illustrates the configuration of an AGC circuit according to Embodiment 1 of the invention.

As illustrated in FIG. 1, the AGC circuit of Embodiment 1 controls the gain of a variable gain amplifier 1 in accordance with a value of an input signal VA input through a signal input terminal A.

The variable gain amplifier 1 has the gain changed in accordance with a gain control signal V8. An output signal VB from the variable gain amplifier 1 is output from a signal output terminal B and input to a count control signal generating section 30.

The count control signal generating section 30 includes a rectifier 2 for detecting/rectifying the output signal VB of the variable gain amplifier 1; and a threshold voltage comparator 3 for comparing an output voltage V1 of the rectifier 2 with a threshold voltage V2 input through a terminal 4.

An output V3 of the count control signal generating section 30 is input to a count control terminal 6 of an up/down counter 5 as a count control signal V4.

When the count control signal V4 input to the count control terminal 6 has a voltage at a high level, the up/down counter 5 performs up-count in accordance with an up-count clock signal V5 input to an up-count clock terminal 7, and when the count control signal V4 has a voltage at a low level, it performs down-count in accordance with a down-count clock signal V6 input to a down-count clock terminal 8.

A count value CNT1 of the up/down counter 5 is converted by a gain control signal generating section 31 into the gain control signal V8 used for controlling the gain of the variable gain amplifier 1.

The gain control signal generating section 31 includes a digital/analog (D/A) converter 9 for converting the count value CNT1 of the up/down counter 5 into a voltage; and a gain control signal amplifier 10 for amplifying a DC output voltage V7 of the D/A converter section 9.

The up-count clock signal V5 and the down-count clock signal V6 are respectively input to the up-count clock terminal 7 and the down-count clock terminal 8 of the up/down counter 5.

The count value CNT1 of the up/down counter 5 and the output signal VB of the variable gain amplifier 1 are input further to a state detector section 21.

The state detector section 21 detects an operation state of the AGC circuit on the basis of the count value CNT1 and the output signal VB and outputs, as a state detection signal STATE, a voltage at a high level when the AGC circuit is in a steady state and outputs a voltage at a low level when it is in a state other than the steady state.

The state detector section 21 detects whether the AGC circuit is in the steady state or in another state by detecting change in amplitude of the output signal of the variable gain amplifier 1 or detecting change in the gain caused in a prescribed period of time.

Alternatively, the state detector section 21 may detect whether the AGC circuit is in the steady state or in another state by detecting, on the basis of the count value CNT1 of the up/down counter 5, whether or not at least one of an up-count operation and a down-count operation is continuously performed repeatedly by a prescribed number of or more times.

Alternatively, the state detector section 21 may detect two or more out of the change in the gain of the variable gain amplifier 1 caused in the prescribed period of time, the change in amplitude of the output signal of the variable gain amplifier 1 and whether or not at least one of the up-count operation and the down-count operation of the up/down counter 5 is continuously performed repeatedly by the prescribed number of or more times.

The state detector section 21 has basically the same configuration also in embodiments described below even though the numbers of up/down counters and D/A converters corresponding to targets of the detection are different.

When the state detector section 21 detects that the operation state of the AGC circuit is the steady state, the count value CNT1 of the up/down counter 5 and the DC output voltage V7 of the D/A converter section 9 are controlled in accordance with the state detection signal STATE so as to keep, regardless of the input states, values obtained immediately before or after low-to-high transition of the state detection signal STATE. In other words, the operations of the up/down counter 5 and the D/A converter section 9 are controlled so as to fix the gain control signal V8.

Incidentally, the variable gain amplifier 1 of this embodiment has a characteristic that the gain is smaller as the gain control signal V8 is at a higher level.

Now, the operation of the AGC circuit of Embodiment 1 will be described.

Figure 20:
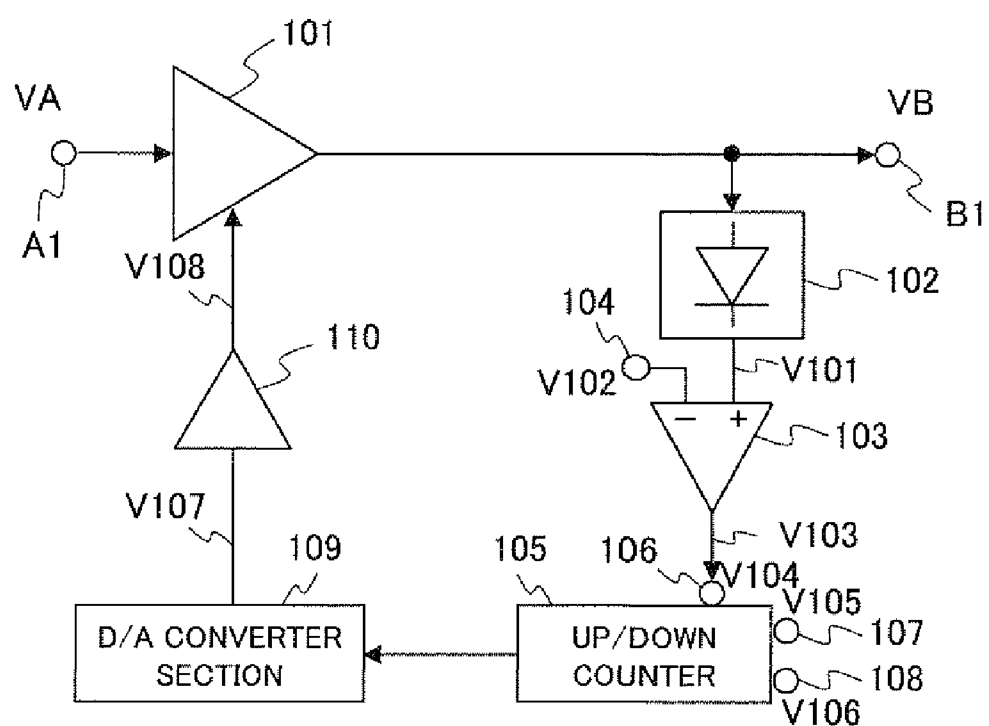
FIG. 20 is a block diagram illustrating the configuration of an AGC circuit according to a conventional example.
Figure 21:
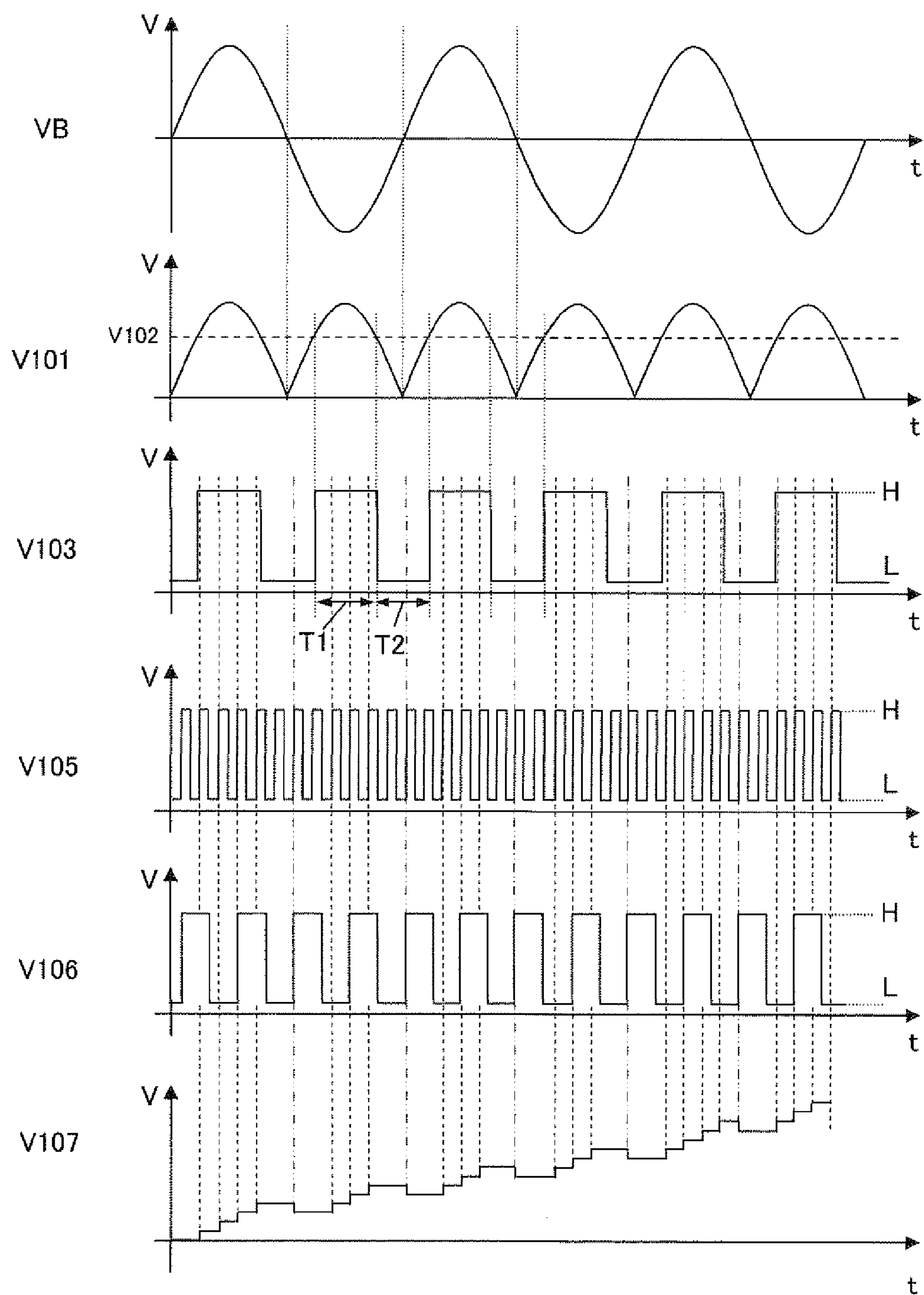
FIG. 21 illustrates graphs of waveforms of signals of respective sections obtained in a basic operation of the AGC circuit of the conventional example.
Figure 22:
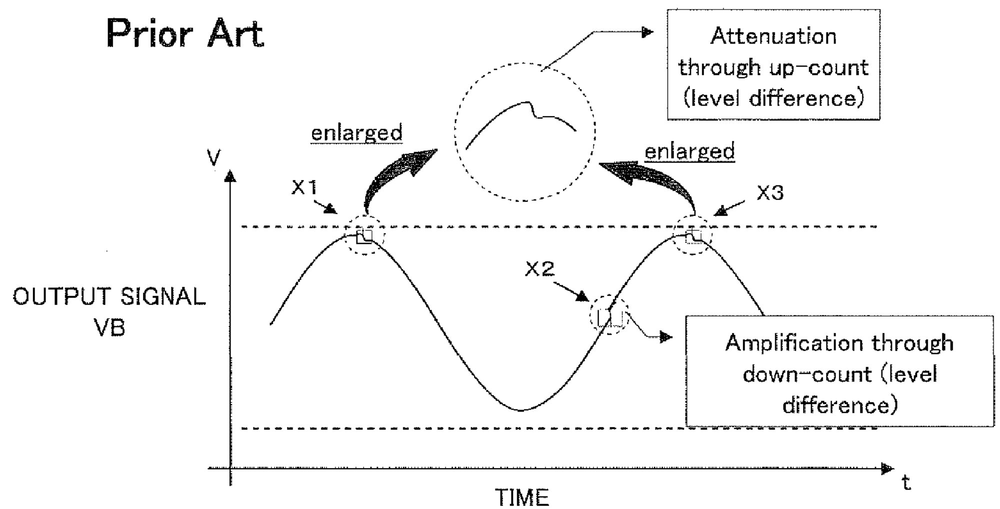
FIG. 22 is a waveform diagram to be used for explaining a problem occurring in an output signal of the AGC circuit of the conventional example.
Figure 23A:
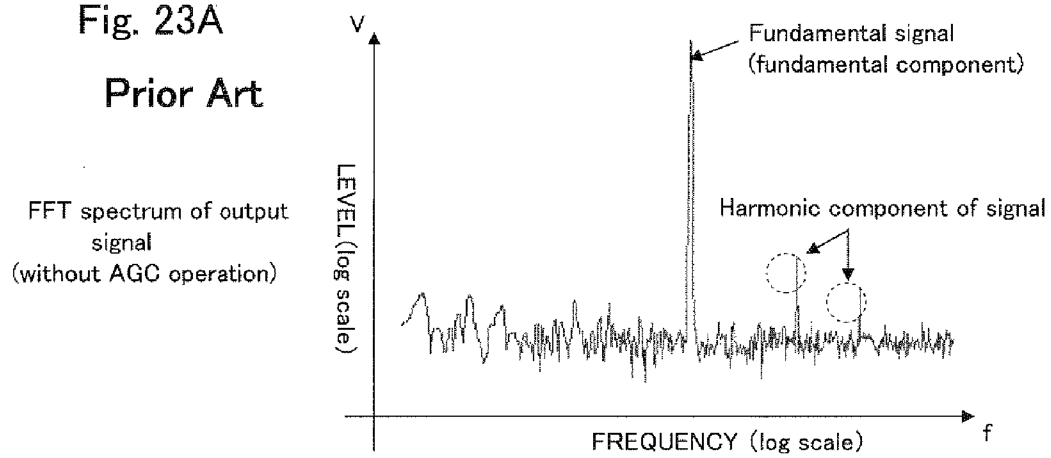
FIGS. 23A and 23B are graphs of FFT spectra of the output signal of the AGC circuit of the conventional example obtained with an AGC operation performed and without performing the AGC operation.
Figure 23B:
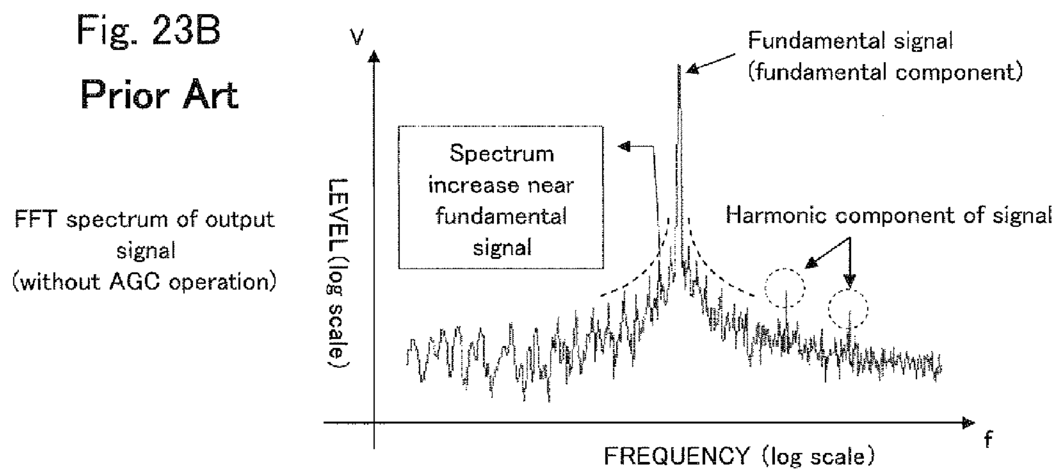

The operation is similar to the operation described with respect to the conventional AGC circuit illustrated in FIG. 20 except that the operation state of the AGC circuit is detected for controlling the operations of the up/down counter 5 and the D/A converter section 9 when the steady state is detected.

When the AGC circuit of this embodiment enters the steady state where the output signal VB of the variable gain amplifier 1 is stable at a constant amplitude level, the variation in the output signal VB naturally becomes small, and the variation in the count value CNT1 of the up/down counter 5 also becomes small accordingly. The state detector section 21 determines that the operation state of the AGC circuit is the steady state when the ranges of these variations fall within arbitrarily set values, and then outputs the state detection signal STATE at a high level.

When the state detector section 21 detects that the operation state of the AGC circuit is the steady state, the count value CNT1 of the up/down counter 5 and the DC output voltage V7 of the D/A converter section 9 are kept in accordance with the state detection signal STATE, regardless of their input states, at the values obtained immediately before or after the low-to-high transition of the state detection signal STATE, and therefore, in the steady state where the output signal VB is stable at the constant amplitude level, occurrence of minute changes (level differences) derived from attenuation and amplification of the output signal VB may be suppressed, so as to suppress spectrum increase otherwise caused in the vicinity of a fundamental signal. As a result, when the embodiment is applied to, for example, audio signal processing, an AGC circuit better for auditory sensation may be realized.

Although the variation range of the output signal VB is detected for detecting the state in this embodiment, the variation range of the output voltage V1 of the rectifier 2 may be detected instead.

Furthermore, although the count value CNT1 of the up/down counter 5 and the output signal VB are input to the state detector section 21 for detecting the state, merely one of them may be input to the state detector section 21.

It is noted that the state detector section may employ any configuration as far as it may detect that the operation state of the AGC circuit is the steady state.

Although the up/down counter and the D/A converter section are both controlled in accordance with the state detection signal in this embodiment, merely one of them may be controlled.

Moreover, it is obvious that the AGC circuit of this invention may be realized by disconnecting a signal path from the up/down counter 5 to the D/A converter section 9 when it is detected that the AGC circuit is in the steady state.

The rest of the configuration employed in this case is the same as that described in Embodiment 1 and hence the description is omitted.

Embodiment 2

Embodiment 2 of the invention will now be described with reference to the accompanying drawing.

Figure 2:
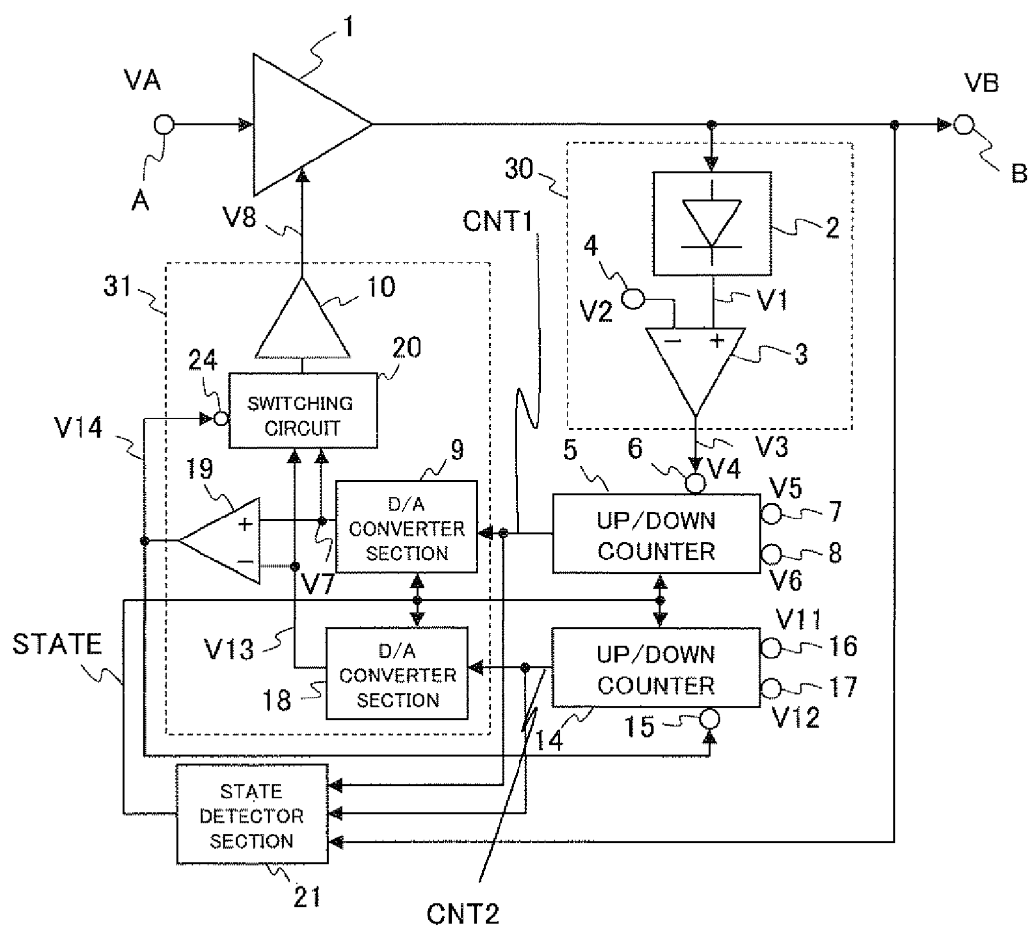
FIG. 2 is a block diagram illustrating the configuration of an AGC circuit according to Embodiment 2 of the invention.

FIG. 2 illustrates the configuration of an AGC circuit according to Embodiment 2 of the invention.

As illustrated in FIG. 2, in the AGC circuit of Embodiment 2, an output signal VB of a variable gain amplifier 1 whose gain is changed in accordance with a gain control signal V8 is input to a count control signal generating section 30.

The count control signal generating section 30 includes a rectifier 2 for detecting/rectifying the output signal VB of the variable gain amplifier 1; and a threshold voltage comparator 3 for comparing an output voltage V1 of the rectifier 2 with a threshold voltage V2.

An output V3 of the count control signal generating section 30 is input to a first count control terminal 6 of a first up/down counter 5 as a first count control signal V4.

When the first count control signal V4 applied to the first count control terminal 6 has a voltage at a high level, the first up/down counter 5 performs up-count in accordance with an up-count clock signal V5 input to a first up-count clock terminal 7, and when the first count control signal V4 has a voltage at a low level, it performs down-count in accordance with a down-count clock signal V6 input to a first down-count clock terminal 8.

The AGC circuit of this embodiment includes a second up/down counter 14. When a second count control signal (V14) applied to a second count control terminal 15 has a voltage at a high level, the second up/down counter 14 performs up-count in accordance with a second up-count clock signal V11 input to a second up-count clock terminal 16, and when the second count control signal V14 has a voltage at a low level, it performs down-count in accordance with a second down-count clock signal V12 input to a second down-count clock terminal 17.

A gain control signal generating section 31 generates the gain control signal V8 used for controlling the gain of the variable gain amplifier 1 on the basis of a count value CNT1 of the first up/down counter 5 and a count value CNT2 of the second up/down counter 14.

The gain control signal generating section 31 includes a first D/A converter section 9 for converting the count value CNT1 of the first up/down counter 5 into a voltage; and a second D/A converter section 18 for converting the count value CNT2 of the second up/down counter 14 into a voltage.

A DC output voltage V7 of the first D/A converter section 9 and a DC output voltage V13 of the second D/A converter section 18 are input to a gain control signal switching circuit 20.

A switching control terminal 24 of the gain control signal switching circuit 20 is connected to the output voltage V14 of a switching signal generating section 19, that is, a voltage comparator.

The switching signal generating section 19 compares the DC output voltage V7 of the first D/A converter section 9 with the DC output voltage V13 of the second D/A converter section 18. Accordingly, a higher one of the DC output voltage V7 of the first D/A converter section 9 and the DC output voltage V13 of the second D/A converter section 18 is selectively output by the gain control signal switching circuit 20.

An output of the gain control signal switching circuit 20 is amplified by a gain control signal amplifier 10 to be supplied as the gain control signal V8 for the variable gain amplifier 1.

The output voltage V14 of the switching signal generating section 19 is also connected to the second count control terminal 15 of the second up/down counter 14. Therefore, when the DC output voltage V7 of the first D/A converter section 9 is higher than the DC output voltage V13 of the second D/A converter section 18, the second up/down counter 14 performs the up-count operation, and when the DC output voltage V7 of the first D/A converter section 9 is lower than the DC output voltage V13 of the second D/A converter section 18, it performs the down-count operation.

The count value CNT1 of the first up/down counter 5, the count value CNT2 of the second up/down counter 14 and the output signal VB of the variable gain amplifier 1 are further input to a state detector section 21.

The state detector section 21 detects an operation state of the AGC circuit on the basis of the count value CNT1, the count value CNT2 and the output signal VB, and outputs, as a state detection signal STATE, a voltage at a high level when the steady state is detected and outputs a voltage at a low level when a state other than the steady state is detected.

When the state detector section 21 detects that the operation state of the AGC circuit is the steady state, the count value CNT1 the first up/down counter 5, the DC output voltage V7 of the first D/A converter section 9, the count value CNT2 of the second up/down counter 14 and the DC output voltage V13 of the second D/A converter section 18 are controlled in accordance with the state detection signal, so as to keep, regardless of their input states, values obtained immediately before or after low-to-high transition of the state detection signal STATE. Thus, the gain control signal V8 is fixed.

Now, the operation of the AGC circuit according to Embodiment 2 will be described. The AGC circuit of Embodiment 2 uses two up/down counters, to which clocks of different frequencies are respectively supplied as count operation clocks. When the AGC circuit is used for, for example, audio signal processing, distortion is caused if ripple of a detected/rectified signal remains in a gain control signal. In order to suppress the occurrence of this distortion, the frequency of the second down-count clock signal V12 is set to be lower than the frequency of a signal amplified by the variable gain amplifier 1 in general. Furthermore, a difference is preferably provided between up-count clocks, so that the frequency of the first up-count clock signal V5 is set to be approximately 1000 times as high as the frequency of the second up-count clock signal V11.

When the AGC circuit of this embodiment enters the steady state where the output signal VB is stable at a constant amplitude level, variation in the output signal VB naturally becomes small, and the count values CNT1 and CNT 2 of the two up/down counters 5 and 14 become small accordingly. When the ranges of these variations fall within arbitrarily set values, the state detector section 21 determines that the operation state of the AGC circuit is the steady state, and outputs the state detection signal STATE at a high level.

When the state detector section 21 detects that the operation state of the AGC circuit is the steady state, the count value CNT1 of the first up/down counter 5, the DC output voltage V7 of the first D/A converter section 9, the count value CNT2 of the second up/down counter 14 and the DC output voltage V13 of the second D/A converter section 18 are kept in accordance with the state detection signal STATE, regardless of their input states, at values obtained immediately before or after low-to-high transition of the state detection signal STATE, and therefore, in the steady state where the output signal VB is stable at a constant amplitude level, occurrence of minute changes (level differences) derived from attenuation and amplification of the output signal VB may be suppressed, so as to suppress spectrum increase otherwise caused in the vicinity of a fundamental signal. As a result, when the embodiment is applied to, for example, the audio signal processing, an AGC circuit better for auditory sensation may be realized.

Although the variation range of the output signal VB is detected for detecting the state in this embodiment, the variation range of the output voltage V1 of the rectifier 2 may be detected instead.

Furthermore, although the count values CNT1 and CNT2 of the two up/down counters 5 and 14 and the output signal VB are input to the state detector section 21 for detecting the state, at least one of the count values CNT1 and CNT2 of the two up/down counters 5 and 14 or the output signal VB alone may be input to the state detector section 21.

It is noted that the state detector section 21 may employ any configuration as far as it may detect that the operation state of the AGC circuit is the steady state.

Moreover, it is obvious that the AGC circuit of this invention may be realized by disconnecting a signal path from the first up/down counter 5 to the first D/A converter section 9 and a signal path from the second up/down counter 14 to the second D/A converter section 18 when it is detected that the AGC circuit is in the steady state.

Embodiment 3

Embodiment 3 of the invention will now be described with reference to the accompanying drawing.

Figure 3:
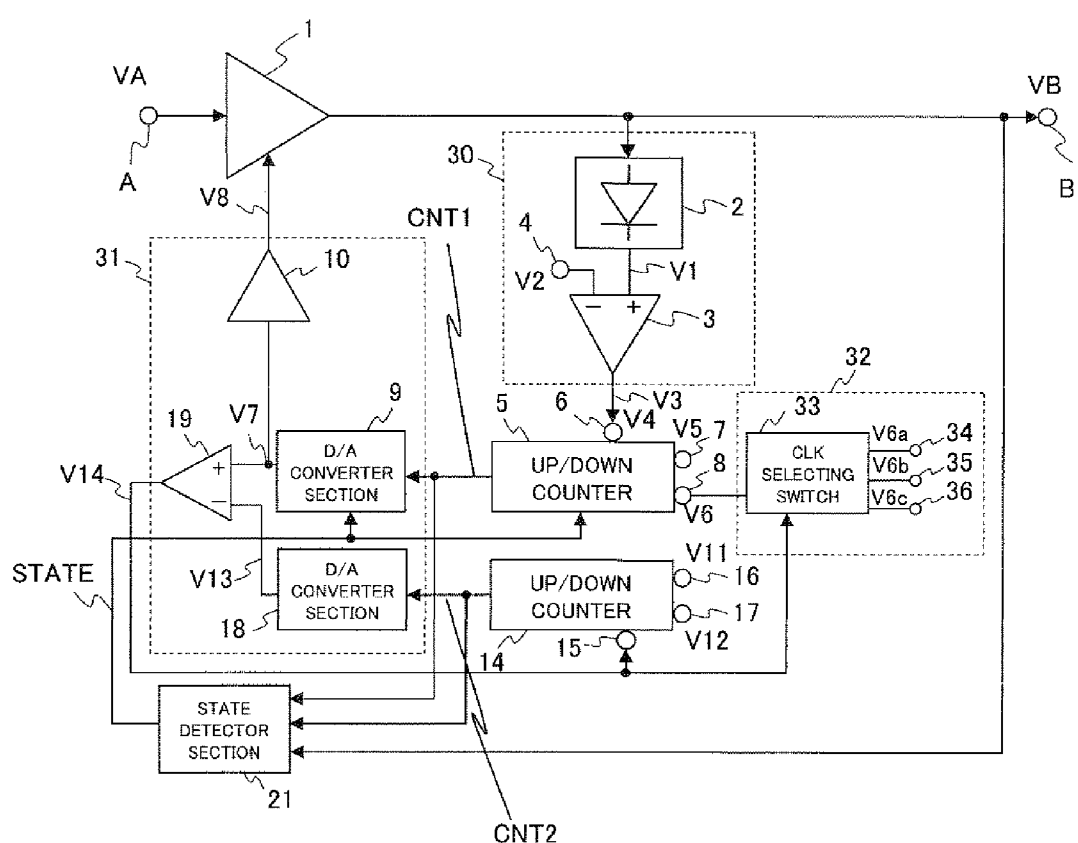
FIG. 3 is a block diagram illustrating the configuration of an AGC circuit according to Embodiment 3 of the invention.

FIG. 3 illustrates the configuration of an AGC circuit according to Embodiment 3 of the invention.

In FIG. 3, like reference numerals are used to refer to like elements used in FIG. 2 so as to omit the description.

In FIG. 3, the gain control signal switching circuit 20 of FIG. 2 is replaced with a down-count clock generating section 32, so as to generate a gain control signal V8 by amplifying a DC output voltage V7 of a first D/A converter section 9 by a gain control signal amplifier 10.

The down-count clock generating section 32 selects one of a plurality of clock pulses V6*a*, V6*b* and V6*c* by a clock signal selecting switch 33 in accordance with an output V14 of a switching signal generating section 19, and supplies the selected pulse to a first up/down counter 5 as a first down-count clock signal V6. Reference numerals 34 through 36 denote clock input terminals.

Furthermore, in Embodiment 3, a state detection signal STATE is not input to a second up/down counter 14 and a second D/A converter section 18, and the operations of the second up/down counter 14 and the second D/A converter section 18 are not switched in accordance with the state detection signal STATE, which is a difference from Embodiment 2.

In Embodiment 2, it is apprehended that distortion may be caused in the waveform of an output signal VB or a signal of a frequency not originally input may be generated by switching the supplier of the gain control signal. In addition, it is apprehended that the gain control signal switching circuit for switching the signal may cause switching noise so as to cause distortion in the waveform of the output signal VB or to generate an abnormal signal. In the AGC circuit of Embodiment 3, however, since there is no need to provide the gain control signal switching circuit, the occurrence of the distortion of the waveform of the output signal VB and the generation of an abnormal signal may be suppressed.

Incidentally, although there is no need to control the operations of the second up/down counter 14 and the second D/A converter section 18 in accordance with the state detection signal STATE in Embodiment 3, the operations of the second up/down counter 14 and the second D/A converter section 18 may be controlled in accordance with the state detection signal STATE together with the operations of the first up/down counter 5 and the first D/A converter section 9.

Embodiment 4

Figure 4:
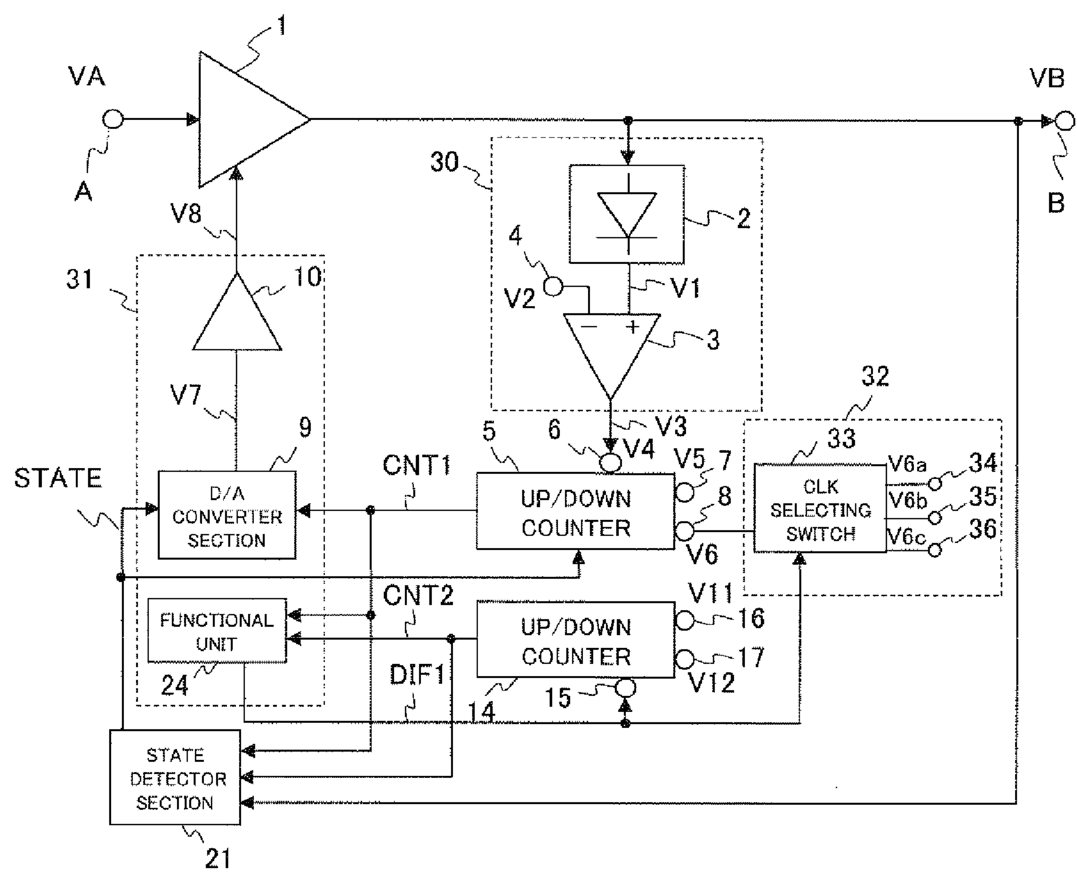
FIG. 4 is a block diagram illustrating the configuration of an AGC circuit according to Embodiment 4 of the invention.

Embodiment 4 of the invention will now be described with reference to the accompanying drawings. FIG. 4 illustrates the configuration of an AGC circuit according to Embodiment 4 of the invention. In FIG. 4, like reference numerals are used to refer to like elements illustrated in FIG. 3 so as to omit the description.

As illustrated in FIG. 4, in the AGC circuit of this embodiment, a signal to be input to a second count control terminal 15 of a second up/down counter 14 is generated by a functional unit 24 that outputs, as digital data, a difference between a count value CNT1 of a first up/down counter 5 and a count value CNT2 of the second up/down counter 14.

Furthermore, a first down-count clock signal V6 is obtained by switching a clock signal selecting switch 33 in accordance with the digital data generated by the functional unit 24.

Owing to this configuration, there is no need to provide the second D/A converter section and the voltage comparator of FIG. 3, and hence, cost reduction and a space saver property can be realized.

(Modification of Embodiment 4)

Figure 5:
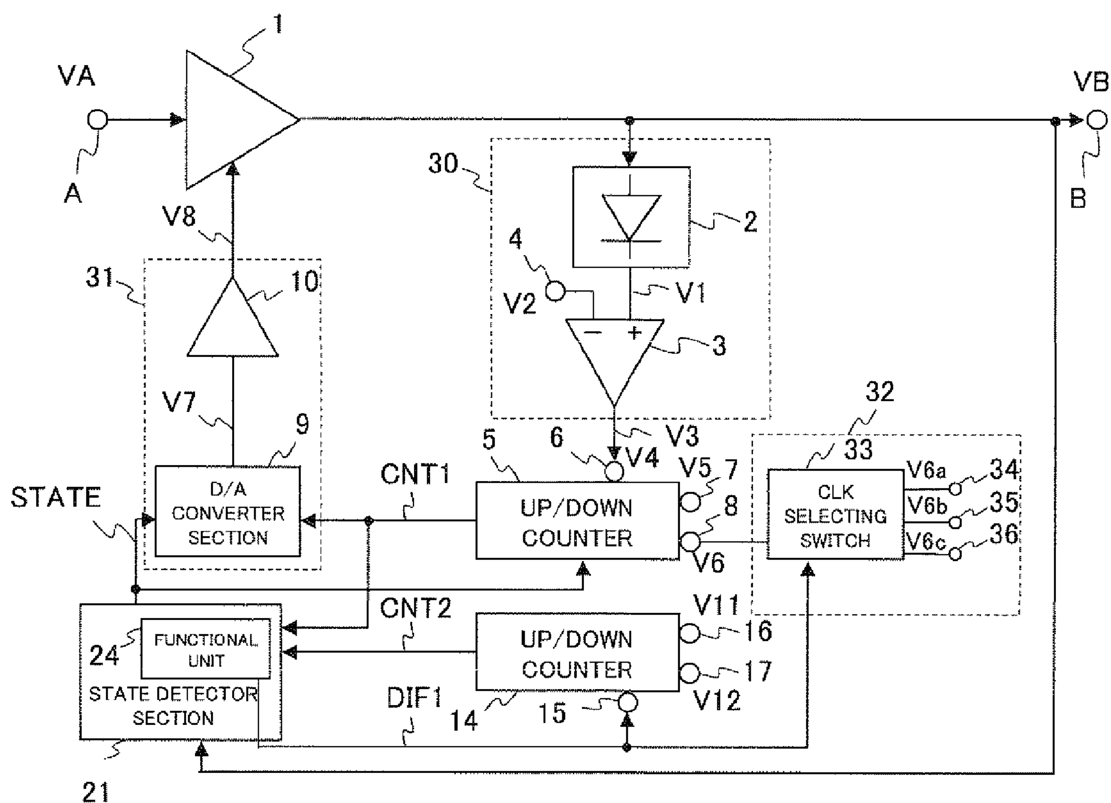
FIG. 5 is a block diagram illustrating the configuration of an AGC circuit according to a modification of Embodiment 4 of the invention.

Although the functional unit 24 that outputs a difference between the count value CNT1 of the first up/down counter 5 and the count value CNT2 of the second up/down counter 14 as digital data is provided in the gain control signal generating section 31 in the configuration exemplified in Embodiment 4, it may be provided in a state detector section 21 as illustrated in FIG. 5.

When the detection of the operation state of the circuit by the state detector section 21 is performed by using the variation range of the count value of an up/down counter, the state detector section 21 has a function to process the count value, and hence, it is easy to incorporate a function to generate a signal to be input to the second count control terminal 15 of the second up/down counter 14 or a signal for controlling the clock signal selecting switch 33 as in Embodiment 4.

When such a configuration is employed, the circuit configuration can be rationalized, so as to realize further cost reduction and a higher space saver property.

Embodiment 5

Embodiment 5 of the invention will now be described with reference to the accompanying drawing.

Figure 6:
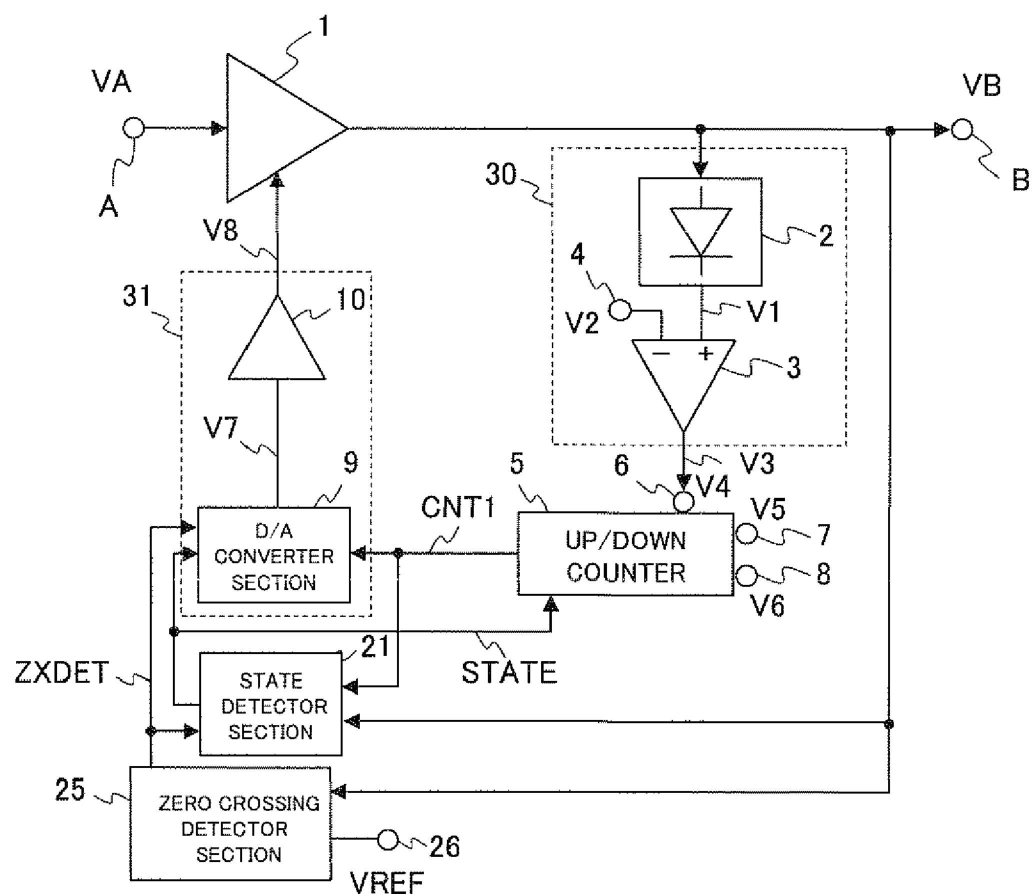
FIG. 6 is a block diagram illustrating a configuration of an AGC circuit according to Embodiment 5 of the invention.

FIG. 6 illustrates the configuration of an AGC circuit according to Embodiment 5 of the invention obtained on the basis of Embodiment 1 illustrated in FIG. 1. In FIG. 6, like reference numerals are used to refer to like elements included in FIG. 1 so as to omit the description.

As illustrated in FIG. 6, the AGC circuit of this embodiment includes a zero crossing detector section 25 that compares an output signal VB of a variable gain amplifier 1 with a reference voltage VREF input through a prescribed reference voltage input terminal 26 for detecting a so-called zero crossing point where the output signal VB and the reference voltage VREF cross each other and outputting a zero crossing detection signal ZXDET to a first D/A converter section 9 and a state detector section 21.

The state detector section 21 receives the zero crossing detection signal ZXDET as an input and performs the state detection operation as described in Embodiment 1 at timing of zero crossing. Specifically, the state detector section 21 detects the operation state always at timing of the zero crossing accompanied with timing of time set by a timer described later, and thus detects the state independently of the AGC circuit itself (i.e., an up/down counter).

The AGC circuit itself switches, on the basis of the detection result obtained by the state detector section 21, timing for updating a gain control signal between (a) a mode for updating it normally (in real time) and (b) a mode for updating it at timing of the zero crossing. In the event, the AGC circuit is operated regardless of the detection result obtained by the state detector section 21, and the state detector section 21 performs the same operation no matter whether the AGC circuit is in the steady state or not.

The first D/A converter section 9 is operated on the basis of a state detection signal STATE output from the state detector section 21, so as to update a value of an output signal V7 in synchronization with the zero crossing detection signal ZXDET in the steady state and to output a value in accordance with an output signal CNT1 of an up/down counter 5 regardless of the zero crossing detection signal ZXDET in a state other than the steady state.

When such a configuration is employed, in the steady state where the output signal VB is stable at a constant amplitude level, occurrence of minute changes (level differences) derived from attenuation and amplification of the output signal VB can be suppressed and spectrum increase otherwise caused in the vicinity of a fundamental signal can be suppressed as well as high responsibility can be retained because there is no need to halt the operation of the AGC circuit in the steady state, and when the embodiment is applied to, for example, audio signal processing, an AGC circuit for better auditory sensation may be realized.

Figure 16:
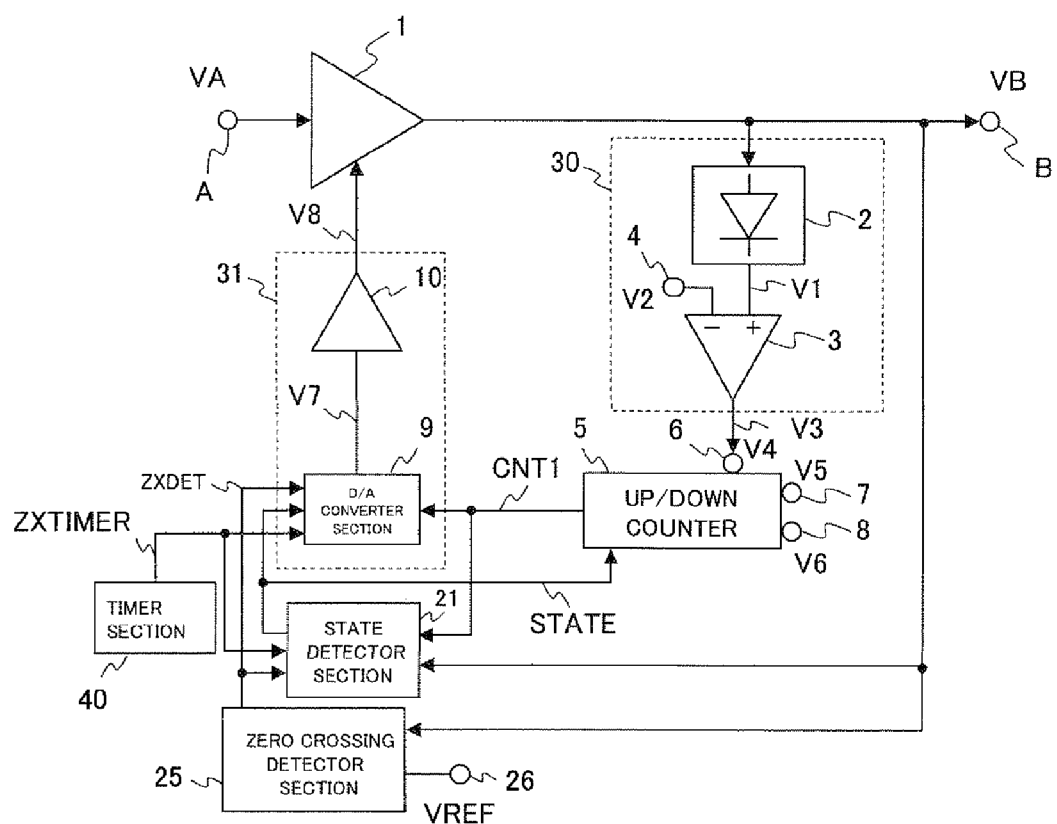
FIG. 16 is a block diagram illustrating still another configuration of the AGC circuit according to the modification of Embodiment 5 of the invention.

Furthermore, the AGC circuit of this embodiment may include a timer section 40 for outputting a timing signal ZXTIMER with a pulse period set to prescribed time as illustrated in FIG. 16, so that the first D/A converter section 9 may update the value of the output signal V7 in synchronization with the timing signal ZXTIMER in the steady state.

When such a configuration is employed, even in the case where an interval between zero crossing points is very large because a signal of a very low frequency of, for example, approximately several tens Hz is input, the detection operation can be stably performed.

Figure 17:
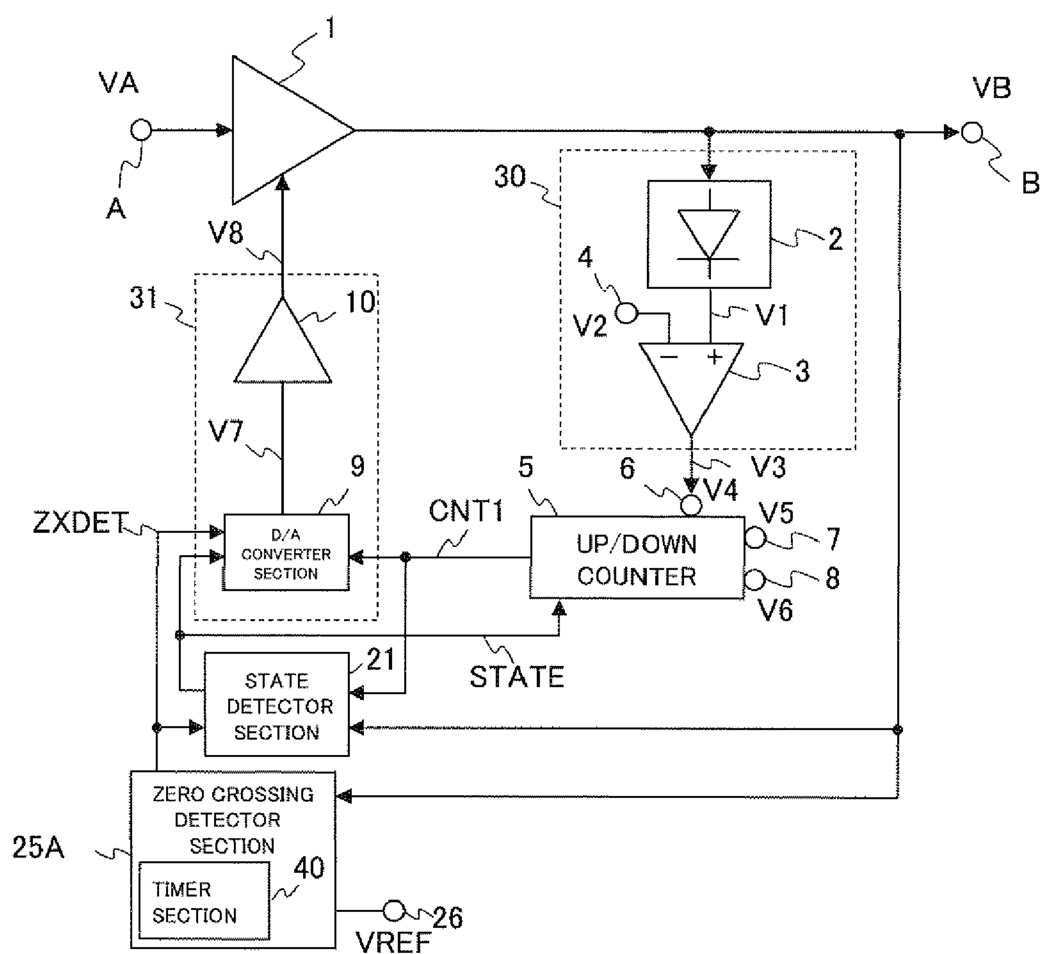
FIG. 17 is a block diagram illustrating still another configuration of the AGC circuit according to the modification of Embodiment 5 of the invention.

Alternatively, a zero crossing detector section 25A including the timer section 40 of FIG. 16 may be used as illustrated in FIG. 17.

Figure 18:
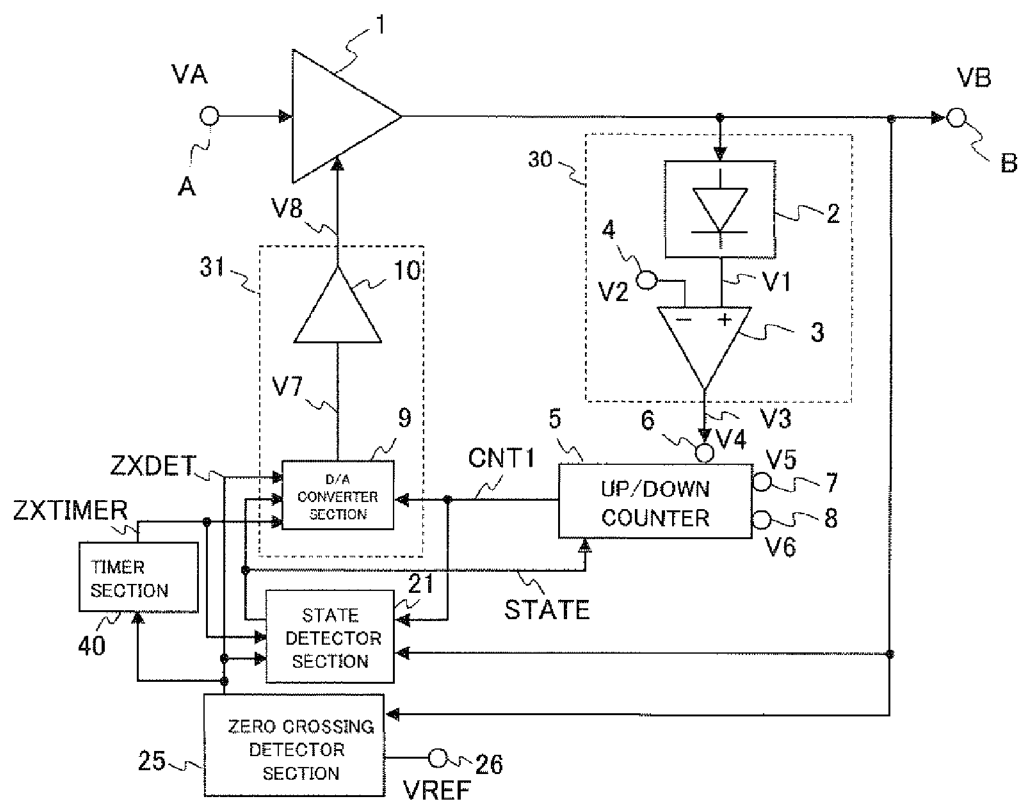
FIG. 18 is a block diagram illustrating still another configuration of the AGC circuit according to the modification of Embodiment 5 of the invention.

Furthermore, in the AGC circuit of this embodiment, as illustrated in FIG. 18, the timer section 40 may be reset at timing of the zero crossing in accordance with the zero crossing detection signal ZXDET, and the first D/A converter section 9 may update the value of the output signal V7 in synchronization with either of the zero crossing detection signal ZXDET and the timing signal ZXTIMER in the steady state.

When such a configuration is employed, for example, in the case where there is a relationship of fin≧0.5×ftimer between a frequency ftimer of the timing signal ZXTIMER and a frequency fin of the input signal, the first D/A converter section 9 may update the value of the output signal V7 in synchronization with the zero crossing detection signal ZXDET in the steady state because the period of a zero crossing point is shorter than the pulse period of the timing signal ZXTIMER, and in the case where there is a relationship of fin<0.5×ftimer, the first D/A converter section 9 may update the value of the output signal V7 in synchronization with the timing signal ZXTIMER in the steady state because the period of a zero crossing point is longer than the pulse period of the timing signal ZXTIMER. In other words, the state detector section 21 detects the state of the circuit operation on the basis of earlier one of an arbitrary period set by the timer section 40 and a period defined by the timing of the zero crossing detected by the zero crossing detector section 25. Therefore, it is possible to realize an AGC circuit in which the state of the circuit operation is stably detected with respect to an input signal of a frequency higher than a frequency defined based on an arbitrary period set by the timer section 40 and higher responsibility is attained even when a signal of a frequency lower than the frequency defined based on the arbitrary period set by the timer section 40 is input.

Figure 19:
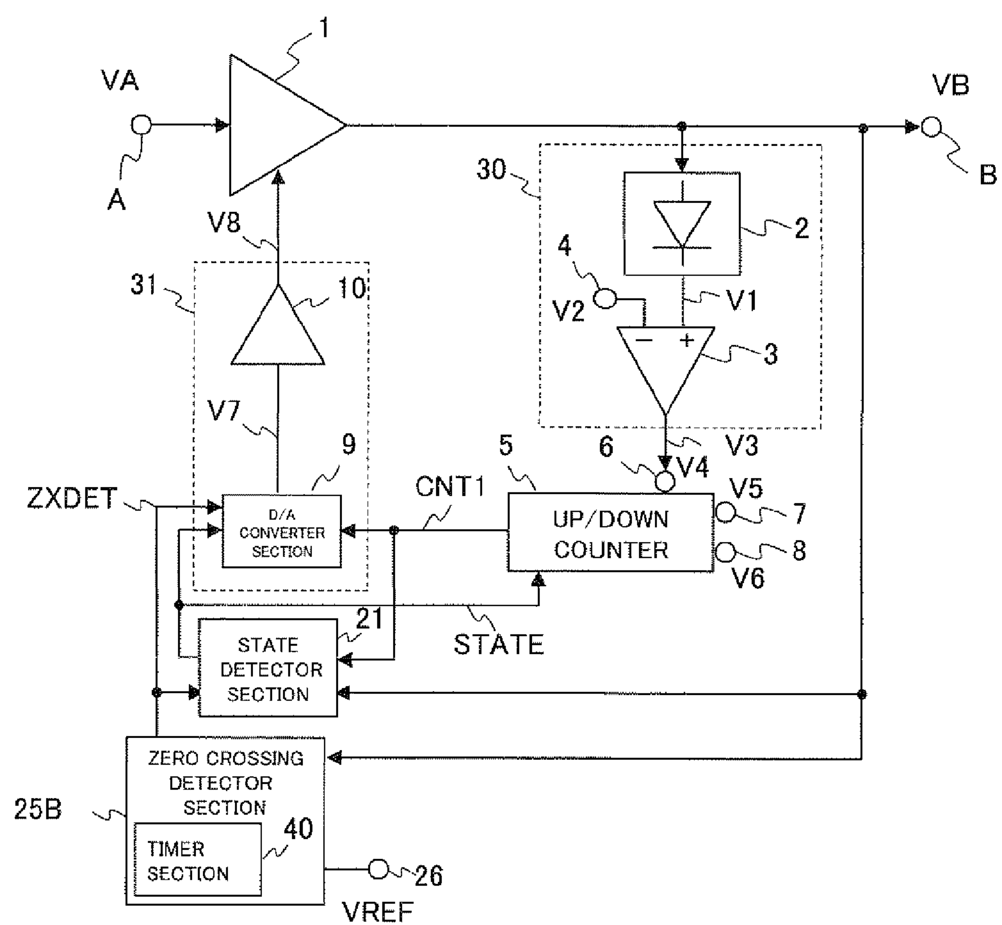
FIG. 19 is a block diagram illustrating still another configuration of the AGC circuit according to the modification of Embodiment 5 of the invention.

Alternatively, a zero crossing detector section 25B including the timer section 40 of FIG. 18 may be used as illustrated in FIG. 19.

Incidentally, although there is no need to control the operations of a second up/down counter 14 and a second D/A converter section 18 in accordance with the state detection signal STATE in Embodiment 5, the operations of the second up/down counter 14 and the second D/A converter section 18 may be controlled in accordance with the state detection signal STATE together with the operations of the first up/down counter 5 and the first D/A converter section 9.

Figure 7:
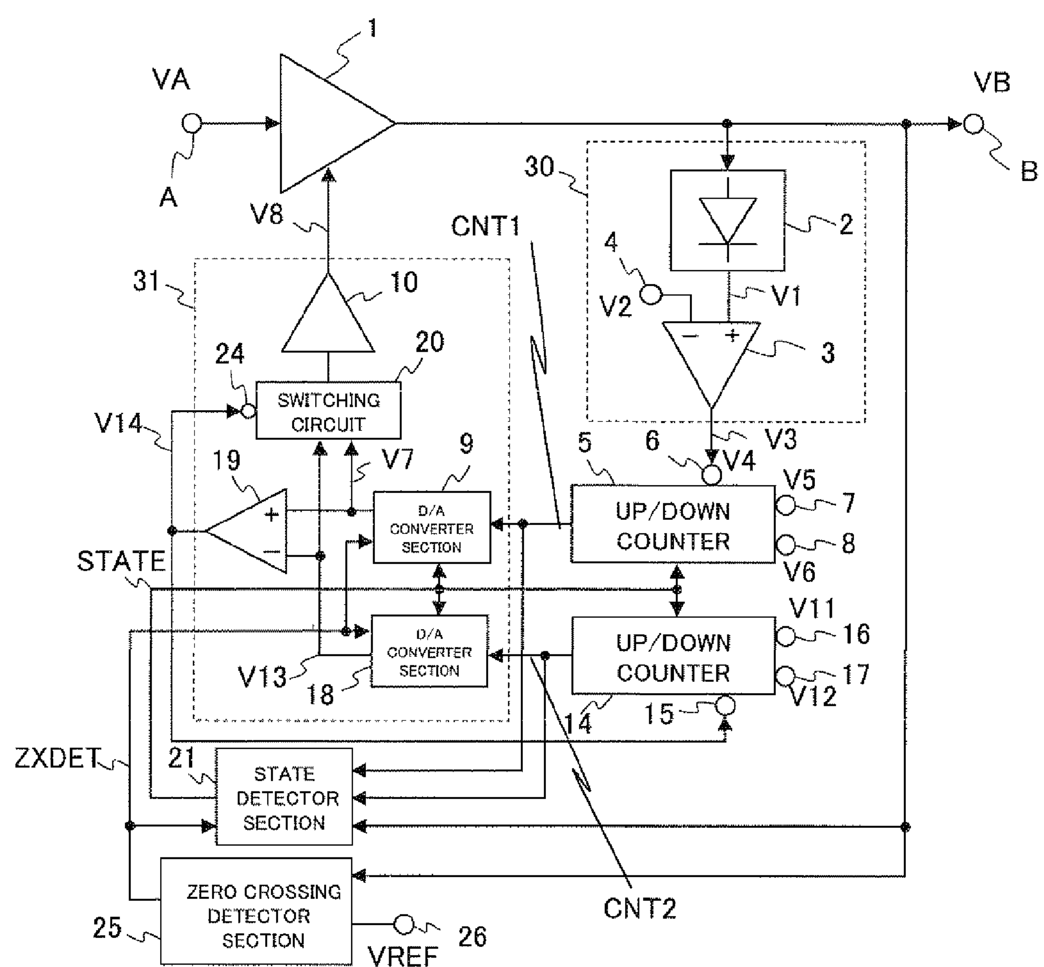
FIG. 7 is a block diagram illustrating another configuration of the AGC circuit according to Embodiment 5 of the invention.
Figure 8:
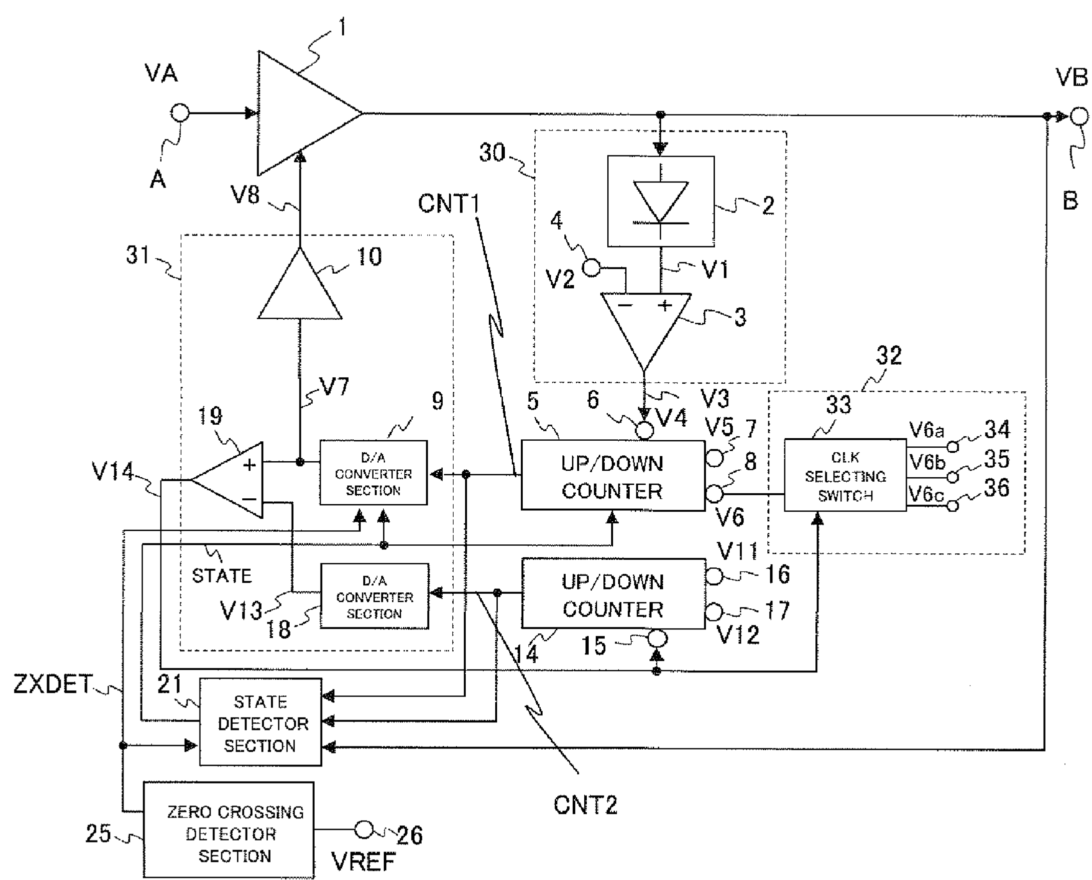
FIG. 8 is a block diagram illustrating still another configuration of the AGC circuit according to Embodiment 5 of the invention.
Figure 9:
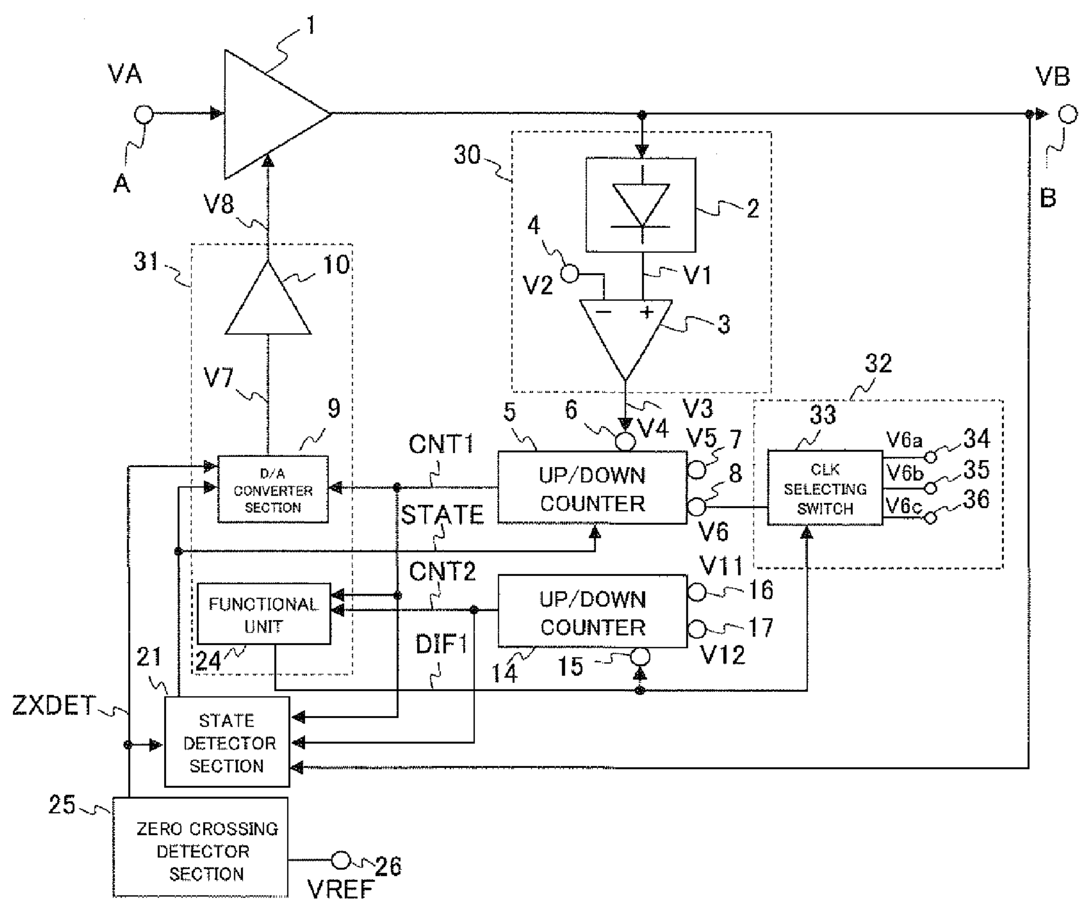
FIG. 9 is a block diagram illustrating still another configuration of the AGC circuit according to Embodiment 5 of the invention.
Figure 10:
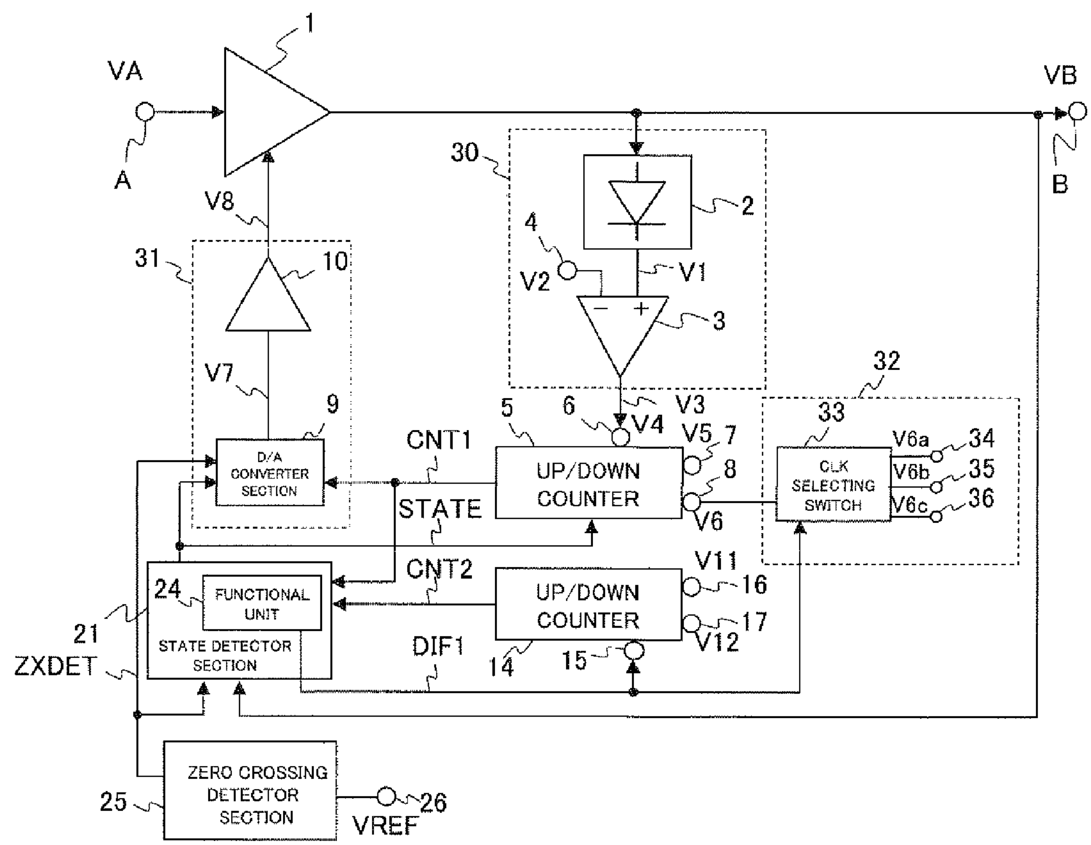
FIG. 10 is a block diagram illustrating still another configuration of the AGC circuit according to Embodiment 5 of the invention.
Figure 11:
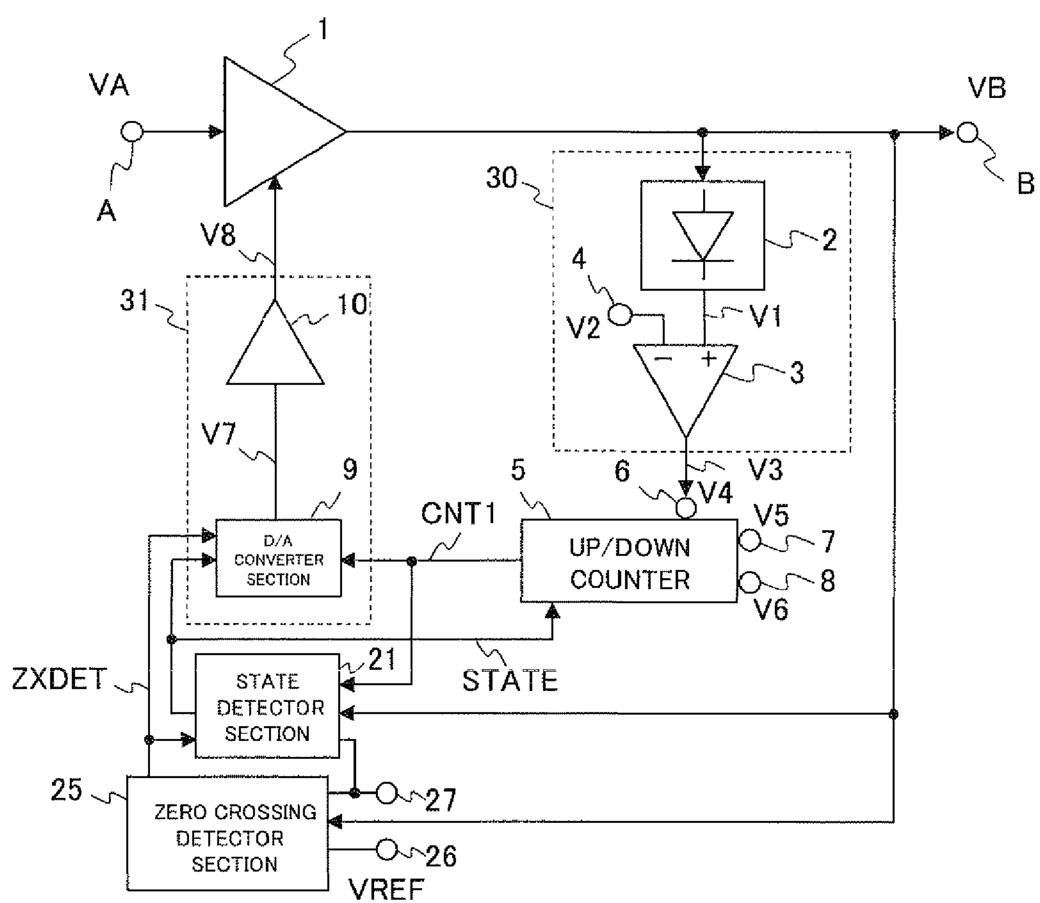
FIG. 11 is a block diagram illustrating a configuration of an AGC circuit according to a modification of Embodiment 5 of the invention.
Figure 12:
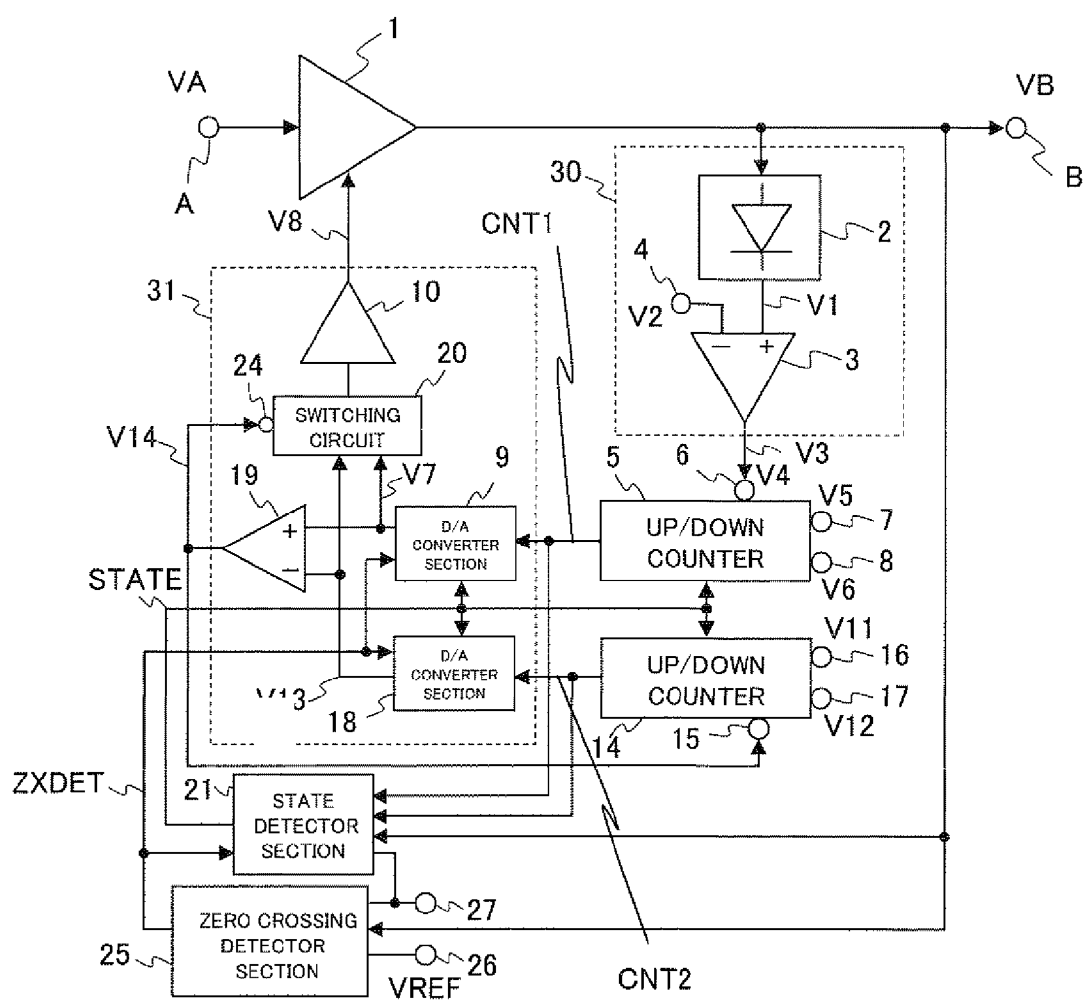
FIG. 12 is a block diagram illustrating another configuration of the AGC circuit according to the modification of Embodiment 5 of the invention.
Figure 13:
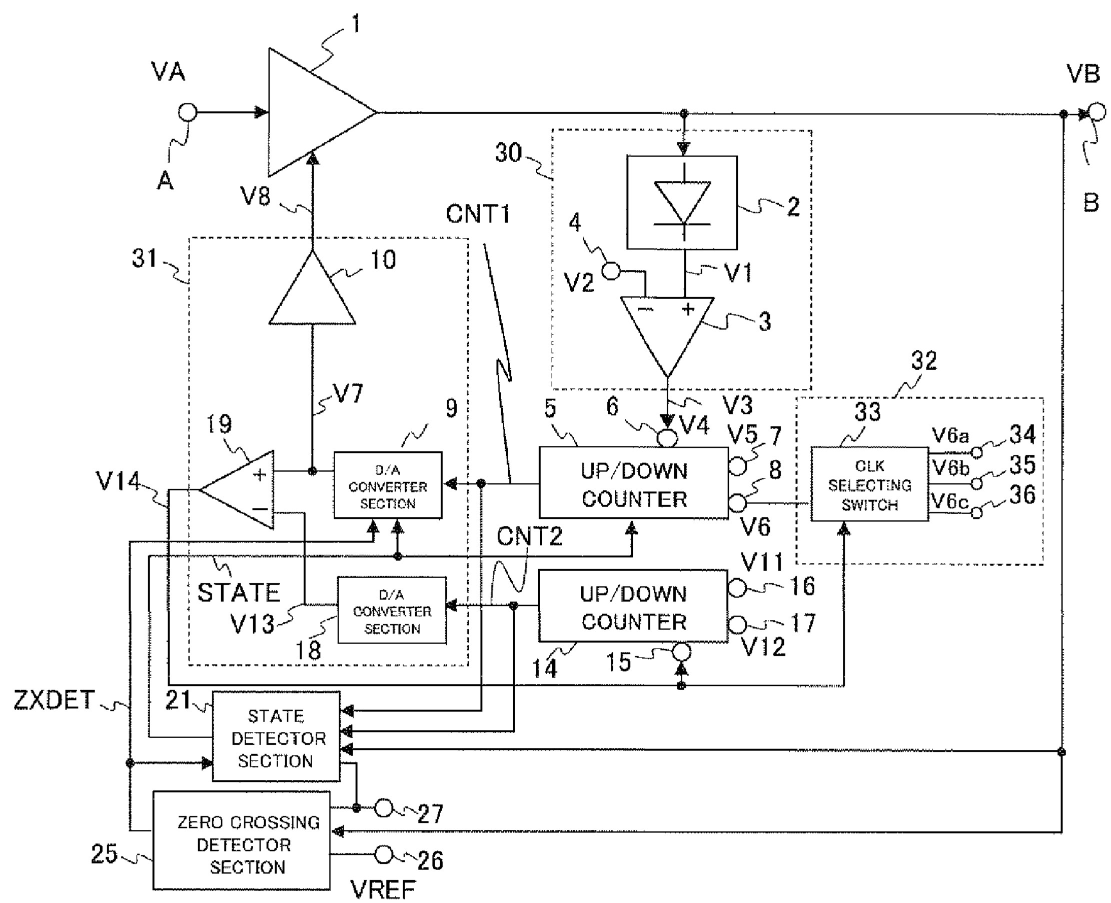
FIG. 13 is a block diagram illustrating still another configuration of the AGC circuit according to the modification of Embodiment 5 of the invention.
Figure 14:
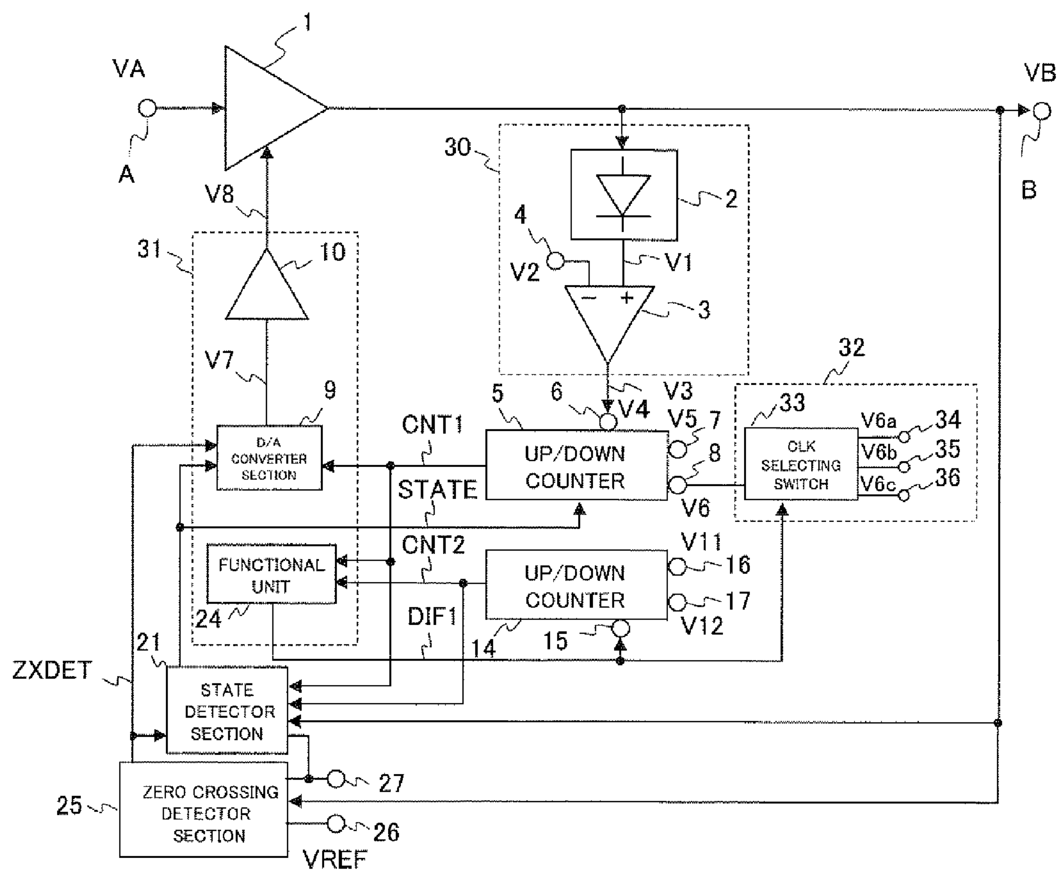
FIG. 14 is a block diagram illustrating still another configuration of the AGC circuit according to the modification of Embodiment 5 of the invention.
Figure 15:
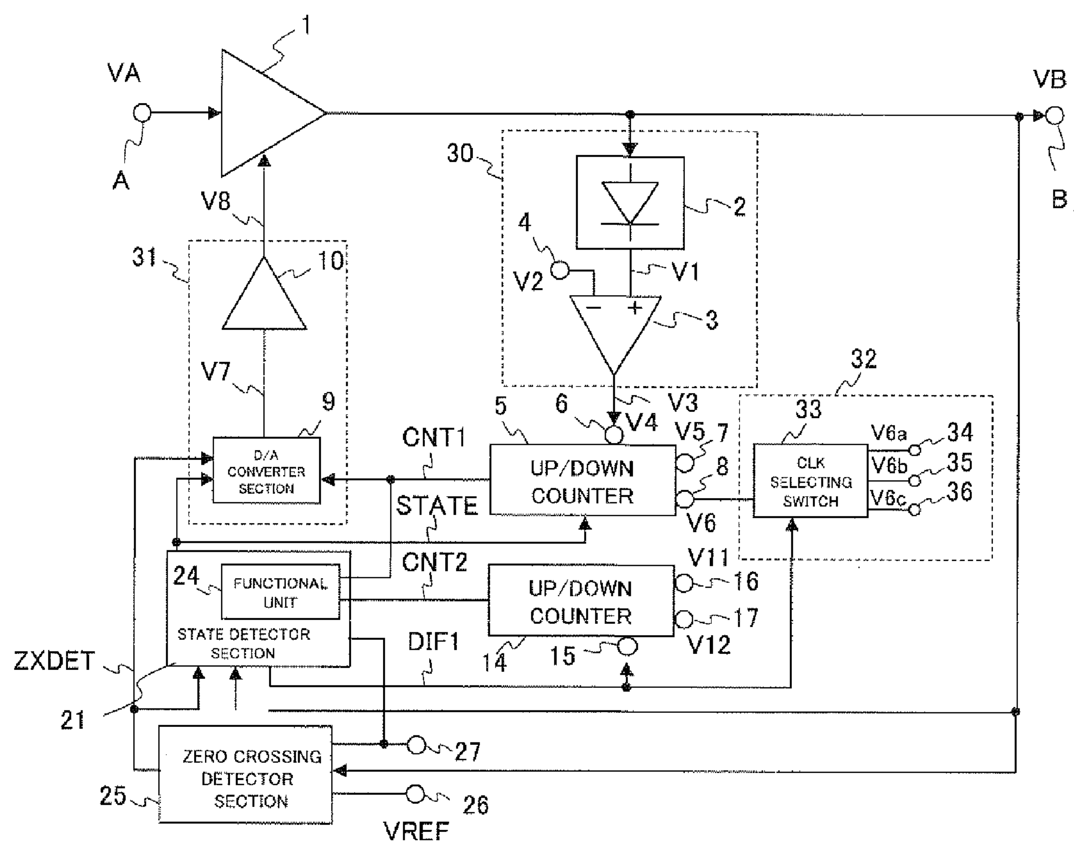
FIG. 15 is a block diagram illustrating still another configuration of the AGC circuit according to the modification of Embodiment 5 of the invention.

Although the description is given on the basis of Embodiment 1 illustrated in FIG. 1, a configuration as illustrated in FIG. 7 may be employed in the configuration of Embodiment 2 illustrated in FIG. 2, a configuration as illustrated in FIG. 8 may be employed in the configuration of Embodiment 3 illustrated in FIG. 3, and it is obvious that a similar AGC circuit of the invention may be realized by employing configurations respectively illustrated in FIGS. 9 and 10 in the configurations of Embodiment 4 respectively illustrated in FIGS. 4 and 5.

Moreover, a zero crossing point may be detected by comparing an input signal VA to the variable gain amplifier 1 with a reference voltage.

Although the configurations of FIGS. 16 through 19 are obtained by additionally providing the timer section 40 in the configuration of FIG. 6, it goes without saying that the timer section 40 of each of FIGS. 16 through 19 may be additionally provided in the configuration of each of FIGS. 7 through 10.

(Modification of Embodiment 5)

Modifications of Embodiment 5 will now be described with reference to FIGS. 11 through 15. FIGS. 11 through 15 illustrate modifications respectively corresponding to FIGS. 6 through 10.

In Embodiment 5, operation modes to be employed when the AGC circuit is in the steady state may include a zero crossing detection operation mode where the first D/A converter circuit 9 updates the value of the output signal V7 in synchronization with the zero crossing detection signal ZXDET and an operation halt mode where the up/down counter 5 and the DC output voltage V7 of the D/A converter section 9 are kept at values obtained immediately before or after low-to-high transition of the state detection signal STATE regardless of their input states, and the state detector section 21 and the zero crossing detector section 25 may be provided with an external control signal input terminal 27, so that the state detector section 21 and the zero crossing detector section 25 may select either of the zero crossing detection operation mode or the operation halt mode on the basis of a control signal input through the external control signal input terminal 27.

When such a configuration is employed, the zero crossing detection operation mode or the operation halt mode may be appropriately selected, in accordance with a signal input to the AGC circuit, as the operation mode to be employed in the steady state, and hence, the AGC circuit can attain higher general usability without increasing the circuit scale.

Although the configurations of FIGS. 16 through 19 are obtained by additionally providing the timer section 40 in the configuration of FIG. 6, it goes without saying that the timer section 40 as illustrated in each of FIGS. 16 through 19 may be additionally provided in the configuration of each of FIGS. 11 through 15.

The specific embodiments of the invention have been described in detail, and it is noted that the invention is not limited to those specific embodiments but may be variously modified without departing from the technical scope of the invention.

INDUSTRIAL APPLICABILITY

According to this invention, an AGC circuit better for auditory sensation is realized without requiring an integrator circuit using a capacitor and the AGC circuit is useful as an AGC circuit or the like for controlling the gain of a variable gain amplifier in accordance with the amplitude of an input signal in a communication system or an audio system.

REFERENCE SIGNS LIST

1 variable gain amplifier
2 rectifier
3 threshold voltage comparator
4 threshold voltage input terminal
5 first up/down counter
6 first count control terminal
7 first up-count clock terminal
8 first down-count clock terminal

9 first D/A converter section
10 gain control signal amplifier
14 second up/down counter
15 second count control terminal
16 second up-count clock terminal
17 second down-count clock terminal
18 second D/A converter section
19 switching signal generating section
20 gain control signal switching circuit
21 state detector section
24 functional unit
25, 25A, 25B zero crossing detector section
26 reference voltage input terminal of zero crossing detector section
27 control signal input terminal of state detector section and zero crossing detector section
30 count control signal generating section
31 gain control signal generating section
32 down-count clock generating section
33 clock signal selecting switch
34 clock input terminal
35 clock input terminal
36 clock input terminal
40 timer section
101 variable gain amplifier
102 rectifier
103 voltage comparator
104 threshold voltage input terminal
105 up/down counter
106 count control terminal
107 up-count clock terminal
108 down-count clock terminal
109 D/A converter section
110 DC amplifier
A signal input terminal
B signal output terminal
A1 signal input terminal
B1 signal output terminal

CITATION LIST

Patent Literature

Patent Literature 1: Japanese Laid-Open Patent Publication No. 60-123115
Patent Literature 2: Japanese Laid-Open Patent Publication No. 2004-274571

The invention claimed is:

1. An AGC circuit comprising:
a variable gain amplifier with a gain controlled in accordance with a gain control signal;
a count control signal generating section for generating a first count control signal on the basis of an output signal of the variable gain amplifier;
a first up/down counter for performing an up-count operation for a first up-count clock signal or a down-count operation for a first down-count clock signal on the basis of the first count control signal;
a gain control signal generating section for generating the gain control signal on the basis of a count value of the first up/down counter; and
a state detector section for detecting a state of a circuit operation and outputting a state detection signal indicating whether the state of the circuit operation is a steady state or another state,
when the state detection signal indicates that the state of the circuit operation is the steady state, an operation of at least one of the first up/down counter and the gain control signal generating section being controlled in such a manner as to fix the gain control signal.

2. The AGC circuit according to claim 1,
wherein the gain control signal generating section includes a first digital/analog converter section for converting the count value of the first up/down counter into an analog signal to be output as the gain control signal.

3. The AGC circuit according to claim 1, further comprising:
a second up/down counter for performing an up-count operation for a second up-count clock signal or a down-count operation for a second down-count clock signal on the basis of a second count control signal,
wherein the gain control signal generating section generates the second count control signal on the basis of a result of comparison between the count value of the first up/down counter and a count value of the second up/down counter, and generates the gain control signal on the basis of a larger one of the count value of the first up/down counter and the count value of the second up/down counter instead of generating the gain control signal on the basis of the count value of the first up/down counter, and
when the state detection signal indicates that the state of the circuit operation is the steady state, an operation of at least one of the first and second up/down counters and the gain control signal generating section is controlled in such a manner as to fix the gain control signal instead of controlling the operation of at least one of the first up/down counter and the gain control signal generating section in such a manner as to fix the gain control signal.

4. The AGC circuit according to claim 3,
wherein the gain control signal generating section includes:
a first digital/analog converter section for converting the count value of the first up/down counter into an analog signal;
a second digital/analog converter section for converting the count value of the second up/down counter into an analog signal;
a gain control signal switching circuit for selecting one of an output of the first digital/analog converter section and an output of the second digital/analog converter section to be output as the gain control signal; and
a signal generating section for generating the second count control signal by comparing the output of the first digital/analog converter section and the output of the second digital/analog converter section, and
the gain control signal switching circuit is controlled in accordance with the second count control signal.

5. The AGC circuit according to claim 1, further comprising:
a second up/down counter for performing an up-count operation for a second up-count clock signal or a down-count operation for a second down-count clock signal on the basis of a second count control signal,
wherein the gain control signal generating section generates the second count control signal on the basis of a result of comparison between the count value of the first up/down counter and a count value of the second up/down counter, and
the AGC circuit further comprises a down-count clock signal generating section for generating the first down count clock signal with a frequency according to the result of the comparison between the count value of the first up/down counter and the count value of the second up/down counter.

6. The AGC circuit according to claim 5, wherein the gain control signal generating section includes:

a first digital/analog converter section for converting the count value of the first up/down counter into an analog signal to be output as the gain control signal;

a second digital/analog converter section for converting the count value of the second up/down counter into an analog signal; and a signal generating section for generating the second count control signal by comparing an output of the first digital/analog converter section and an output of the second digital/analog converter section.

7. The AGC circuit according to claim 5, wherein the gain control signal generating section includes:

a first digital/analog converter section for converting the count value of the first up/down counter into an analog signal to be output as the gain control signal; and a functional unit for generating the second count control signal by calculating to compare the count value of the first up/down counter and the count value of the second up/down counter.

8. The AGC circuit according to claim 5, wherein the gain control signal generating section includes a first digital/analog converter section for converting the count value of the first up/down counter into an analog signal to be output as the gain control signal, and the state detector section includes a functional unit for generating the second count control signal by calculating to compare the count value of the first up/down counter and the count value of the second up/down counter.

9. The AGC circuit according to claim 1, wherein the state detector section detects change in the gain caused in a prescribed period of time in the variable gain amplifier.

10. The AGC circuit according to claim 3, wherein the state detector section detects change in the gain caused in a prescribed period of time in the variable gain amplifier.

11. The AGC circuit according to claim 5, wherein the state detector section detects change in the gain caused in a prescribed period of time in the variable gain amplifier.

12. The AGC circuit according to claim 1, wherein the state detector section detects change in amplitude of the output signal of the variable gain amplifier.

13. The AGC circuit according to claim 3, wherein the state detector section detects change in amplitude of the output signal of the variable gain amplifier.

14. The AGC circuit according to claim 5, wherein the state detector section detects change in amplitude of the output signal of the variable gain amplifier.

15. The AGC circuit according to claim 1, wherein the state detector section detects whether or not at least one of the up-count operation and the down-count operation of the first up/down counter has been continuously performed by a prescribed number of or more times.

16. The AGC circuit according to claim 3, wherein the state detector section detects whether or not at least one of the up-count operation and the down-count operation of at least one of the first up/down counter and the second up/down counter has been continuously performed by a prescribed number of or more times.

17. The AGC circuit according to claim 5, wherein the state detector section detects whether or not at least one of the up-count operation and the down-count operation of at least one of the first up/down counter and the second up/down counter has been continuously performed by a prescribed number of or more times.

18. The AGC circuit according to claim 1, wherein the state detector section detects two or more of change in the gain caused in a prescribed period of time in the variable gain amplifier, change in amplitude of the output signal of the variable gain amplifier and whether or not at least one of the up-count operation and the down-count operation of the first up/down counter has been continuously performed by a prescribed number of or more times.

19. The AGC circuit according to claim 8, wherein the state detector section detects two or more of change in the gain caused in a prescribed period of time in the variable gain amplifier, change in amplitude of the output signal of the variable gain amplifier and whether or not at least one of the up-count operation and the down-count operation of the first up/down counter has been continuously performed by a prescribed number of or more times.

20. The AGC circuit according to claim 1, further comprising a zero crossing detector section for detecting what is called a zero crossing point where an input or an output of the variable gain amplifier crosses a prescribed reference voltage, wherein when the state detection signal indicates that the state of the circuit operation is the steady state, the operation of at least one of the first up/down counter and the gain control signal generating section is controlled in such a manner as to be placed in an operation mode where the gain control signal is updated in synchronization with timing of zero crossing instead of controlling the operation of at least one of the first up/down counter and the gain control signal generating section in such a manner as to fix the gain control signal.

21. The AGC circuit according to claim 8, further comprising a zero crossing detector section for detecting what is called a zero crossing point where an input or an output of the variable gain amplifier crosses a prescribed reference voltage, wherein when the state detection signal indicates that the state of the circuit operation is the steady state, the operation of at least one of the first up/down counter and the gain control signal generating section is controlled in such a manner as to be placed in an operation mode where the gain control signal is updated in synchronization with timing of zero crossing instead of controlling the operation of at least one of the first up/down counter and the gain control signal generating section in such a manner as to fix the gain control signal.

22. The AGC circuit according to claim 1, further comprising a zero crossing detector section for detecting what is called a zero crossing point where an input or an output of the variable gain amplifier crosses a prescribed reference voltage, wherein the AGC circuit has a first operation mode where the operation of at least one of the first up/down counter and the gain control signal generating section is controlled in such a manner as to fix the gain control signal when the state detection signal indicates that the state of the circuit operation is the steady state, and a second operation mode where the operation of at least one of the first up/down counter and the gain control signal generating section is controlled in such a manner as to update the gain control signal in synchronization with timing of zero crossing when the state detection signal indicates that the state of the circuit operation is the steady state, and one of the first operation mode and the second operation mode is selectable.

23. The AGC circuit according to claim 8, further comprising a zero crossing detector section for detecting what is called a zero crossing point where an input or an output of the variable gain amplifier crosses a prescribed reference voltage, wherein the AGC circuit has a first operation mode where the operation of at least one of the first up/down counter and the gain control signal generating section is controlled in such a manner as to fix the gain control signal when the state detection signal indicates that the state of the circuit operation is the steady state, and a second operation mode where the operation of at least one of the first up/down counter and the gain control signal generating section is controlled in such a manner as to update the gain control signal in synchronization with timing of zero crossing when the state detection signal indicates that the state of the circuit operation is the steady state, and one of the first operation mode and the second operation mode is selectable.

24. The AGC circuit according to claim 20, wherein the state detector section detects the state of the circuit operation every arbitrary period set by a timer.

25. The AGC circuit according to claim 22, wherein the state detector section detects the state of the circuit operation every arbitrary period set by a timer.

26. The AGC circuit according to claim 20, wherein the state detector section detects the state of the circuit operation every period defined by the timing of zero crossing detected by the zero crossing detector section.

27. The AGC circuit according to claim 8, further comprising a zero crossing detector section for detecting what is called a zero crossing point where an input or an output of the variable gain amplifier crosses a prescribed reference voltage, wherein the state detector section detects the state of the circuit operation every period defined by the timing of zero crossing detected by the zero crossing detector section.

28. The AGC circuit according to claim 22, wherein the state detector section detects the state of the circuit operation every period defined by the timing of zero crossing detected by the zero crossing detector section.

29. The AGC circuit according to claim 20, wherein the state detector section detects the state of the circuit operation by employing, as a detection period, an earlier one of an arbitrary period set by a timer and a period defined by the timing of zero crossing detected by the zero crossing detector section.

30. The AGC circuit according to claim 8, further comprising a zero crossing detector section for detecting what is called a zero crossing point where an input or an output of the variable gain amplifier crosses a prescribed reference voltage, wherein the state detector section detects the state of the circuit operation by employing, as a detection period, an earlier one of an arbitrary period set by a timer and a period defined by the timing of zero crossing detected by the zero crossing detector section.

31. The AGC circuit according to claim 22, wherein the state detector section detects the state of the circuit operation by employing, as a detection period, an earlier one of an arbitrary period set by a timer and a period defined by the timing of zero crossing detected by the zero crossing detector section.

* * * * *